(12) United States Patent
Oh et al.

(10) Patent No.: US 8,891,300 B2
(45) Date of Patent: Nov. 18, 2014

(54) NONVOLATILE MEMORY DEVICE, MEMORY SYSTEM HAVING THE SAME AND BLOCK MANAGING METHOD, AND PROGRAM AND ERASE METHODS THEREOF

(71) Applicants: Eun Chu Oh, Hwaseong-si (KR); Jaehong Kim, Seoul (KR); Jongha Kim, Seongnam-si (KR); Junjin Kong, Yongin-si (KR)

(72) Inventors: Eun Chu Oh, Hwaseong-si (KR); Jaehong Kim, Seoul (KR); Jongha Kim, Seongnam-si (KR); Junjin Kong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 93 days.

(21) Appl. No.: 13/746,640

(22) Filed: Jan. 22, 2013

(65) Prior Publication Data

US 2013/0198440 A1    Aug. 1, 2013

(30) Foreign Application Priority Data

Jan. 27, 2012  (KR) .................. 10-2012-0008370

(51) Int. Cl.
*G11C 16/04* (2006.01)
*G06F 12/02* (2006.01)
*G11C 11/56* (2006.01)
*G11C 16/10* (2006.01)
*H01L 27/115* (2006.01)

(52) U.S. Cl.
CPC ........ *G06F 12/0246* (2013.01); *G11C 16/0483* (2013.01); *G11C 2211/5641* (2013.01); *G11C 2211/5646* (2013.01); *G11C 11/5628* (2013.01); *G11C 16/10* (2013.01); *H01L 27/11582* (2013.01)
USPC ............. 365/185.03; 365/185.24; 365/230.03

(58) Field of Classification Search
CPC ........... G11C 11/5628; G11C 11/5642; G11C 11/5621
USPC ............... 365/185.03, 185.24, 230.03
IPC ..................... G11C 11/5628, 11/5642, 11/5621
See application file for complete search history.

(56) References Cited

U.S. PATENT DOCUMENTS

| | | | |
|---|---|---|---|
| 5,617,351 A | 4/1997 | Bertin et al. | |
| 5,836,132 A | 11/1998 | Weathersby | |
| 6,657,893 B2 | 12/2003 | Takahashi et al. | |
| 7,057,930 B2 * | 6/2006 | Nakamura | 365/185.11 |
| 7,333,364 B2 * | 2/2008 | Yu et al. | 365/185.09 |
| 7,339,239 B2 | 3/2008 | Forbes | |
| 7,646,693 B2 * | 1/2010 | Antonakopoulos et al. | 369/59.24 |
| 7,940,559 B2 | 5/2011 | Carman | |
| 2002/0064071 A1 | 5/2002 | Takahashi et al. | |
| 2006/0261404 A1 | 11/2006 | Forbes | |
| 2009/0141550 A1 | 6/2009 | Carman | |
| 2010/0238732 A1 | 9/2010 | Hishida et al. | |
| 2011/0216588 A1 * | 9/2011 | Kim et al. | 365/185.03 |
| 2012/0268988 A1 | 10/2012 | Seol et al. | |

* cited by examiner

*Primary Examiner* — Connie Yoha
(74) *Attorney, Agent, or Firm* — Harness, Dickey & Pierce

(57) ABSTRACT

In one embodiment, the method includes overwriting a memory cell storing m-bit data to store n-bit data, where n is less than or equal to m. The memory cell has one of a first plurality of program states when storing the m-bit data, and the memory cell has one of a second plurality of program states when storing the n-bit data. The second plurality of program states include at least one program state not in the first plurality of program states.

45 Claims, 34 Drawing Sheets

Fig. 25

| m-bit PGM | Number of Extra Program State | Erase Frequency Reduction |
|---|---|---|
| 1 | 1 | 50% |
| 2 | 1 | 33% |
| 3 | 1 | 25% |
| 3 | 2 | 40% |
| 3 | 3 | 50% |
| 4 | 1 | 20% |
| 4 | 2 | 33% |
| 4 | 3 | 43% |
| 4 | 4 | 50% |

Fig. 26

| m-bit PGM | Number of Extra Program State | Erase Frequency Reduction |
|---|---|---|
| 1 | 1 | 33% |
| 2 | 1 | 20% |
| 3 | 1 | 14% |
| 3 | 2 | 25% |
| 3 | 3 | 33% |
| 4 | 1 | 11% |
| 4 | 2 | 20% |
| 4 | 3 | 27% |
| 4 | 4 | 33% |

NONVOLATILE MEMORY DEVICE, MEMORY SYSTEM HAVING THE SAME AND BLOCK MANAGING METHOD, AND PROGRAM AND ERASE METHODS THEREOF

CROSS-REFERENCE TO RELATED APPLICATIONS

A claim for priority under 35 U.S.C. §119 is made to Korean Patent Application No. 10-2012-0008370 filed Jan. 27, 2012, in the Korean Intellectual Property Office, the entire contents of which are hereby incorporated by reference.

BACKGROUND

The inventive concepts described herein relate to a nonvolatile memory device, a memory system including the same, a block managing method thereof, and program and erase methods thereof.

A semiconductor memory device is classified into either volatile (hereinafter, referred to as a volatile memory device) or nonvolatile (hereinafter, referred to as a nonvolatile memory device). A nonvolatile memory device keeps contents stored therein even at power-off. A memory cell in the nonvolatile memory device is either one-time programmable or reprogrammed according to the fabrication technology used. Nonvolatile memory devices are used to store program or microcode in a wide variety of applications in the computer, avionics, telecommunications, and consumer electronics industries.

SUMMARY

Some example embodiment relate to a method of managing a memory.

In one embodiment, the method includes overwriting a memory cell storing m-bit data to store n-bit data, where n is less than or equal to m. The memory cell has one of a first plurality of program states when storing the m-bit data, and the memory cell has one of a second plurality of program states when storing the n-bit data. The second plurality of program states include at least one program state not in the first plurality of program states.

In one embodiment, the program state not in the first plurality of program states has a threshold voltage distribution greater than the threshold distributions of the first plurality of states.

In one embodiment, the second plurality of program states includes more than one program state not in the first plurality of program states.

In one embodiment, the method further includes overwriting the memory cell storing n-bit data to store p-bit data, where p is less than or equal to n. The memory cell has a third plurality of memory states when storing the p-bit data, and the third plurality of program states includes at least one program state not in the first plurality and the second plurality of program states. In one embodiment, p is equal to n. In another embodiment, p is less than n.

In one embodiment, the memory including the memory cell is divided into blocks of memory cells, and the method further includes determining if an invalid block including the memory cell is overwritable. An invalid block stores a threshold amount of invalid data. Here, the overwriting is permitted if the determining determines the invalid block including the memory cell is overwritable.

In one embodiment, the determining determines the invalid block is overwritable based on a number of clean blocks in the memory.

In another embodiment, the determining determines the invalid block is overwritable based on a number of free pages in the invalid block, each free page not storing any data.

In one embodiment, the determining determines the invalid block is overwritable based on a health state of the invalid block. The health state indicates a level of deterioration of the invalid block. In one embodiment, the health state may be based on a number of program/erase cycles that the invalid block has undergone. In another embodiment, the health state may be based on a bit error rate for data read from the invalid block.

In a further embodiment, the determining determines the invalid block is overwritable based on a number of clean blocks in the memory and a health state of the invalid block.

In one embodiment, a memory includes the memory cell, the memory is divided into blocks of memory cells, each block being divided into pages, and the method further includes determining if an invalid page including the memory cell is overwritable. The invalid page stores invalidated data. Here, the overwriting is permitted if the determining determines the invalid page including the memory cell is overwritable.

In one embodiment, the determining determines the invalid page is overwritable based on a number of clean blocks in the memory.

In one embodiment, the determining determines the invalid page is overwritable based on a number of free pages in the block including the invalid page, each free page not storing any data.

In one embodiment, the determining determines the invalid page is overwritable based on a health state of the block including the invalid page. The health state indicates a level of deterioration of the block. In one embodiment, the health state may be based on a number of program/erase cycles that the invalid block has undergone. In another embodiment, the health state may be based on a bit error rate for data read from the invalid block.

In one embodiment, the determining determines the invalid page is overwritable based on a number of clean pages in the block including the invalid page and a health state of the block.

In one embodiment, the method further includes storing a first indicator indicating that the memory cell is overwritable if the determining determines the memory cell is overwritable. The storing may store the first indicator in a table of a memory controller and/or the memory. The memory controller is configured to control the memory.

In one embodiment, the method additionally includes storing a second indicator indicating that the memory cell has been overwritten after the overwriting. The storing a second indicator stores the second indicator in a table of the memory controller and/or the memory.

In one embodiment, the method also includes storing a third indicator indicating a number of times the memory cell has been overwritten since last erased after the overwriting. The storing a third indicator stores the third indicator in a table of a memory controller and/or the memory.

At least one embodiment relates to a method of managing a memory having a plurality of memory cells divided into blocks.

In one embodiment, the method includes storing state information for at least one of the blocks. The state information indicates one of a clean state, a programmed state, an invalid state, an overwritable state, and an overwritten state.

The clean state indicates the block is erased, the programmed state indicates the block stores valid data, the invalid state indicates the block stores invalid data, the overwritable state indicates that overwriting of invalid data stored in the block without erasing the block is permitted, and the overwritten state indicates that at least a portion of the data stored in the block has been overwritten without erasing the block. An operation is then performed on the block based on the state information.

In one embodiment, the method further includes permitting changing the state information for the block to the overwritable state only if a current state of the block is the invalid state.

In one embodiment, the performing selectively overwrites data in the block only if the state information of the block indicates the overwritable state.

In one embodiment, the method further includes changing the state information of the block to the overwritten state after overwriting of the block.

In another embodiment, the method further includes storing an overwrite number if the state information indicates the overwritten state, the overwrite number indicating a number of times since the block was last erased. The storing may store the state information in the memory and/or a controller of the memory.

In one embodiment, the storing stores the state information in a page of the block.

In one embodiment, the overwritten state indicates the block stores valid data.

In one embodiment, the overwritten state indicates the block stores less data per memory cell than stored during the programmed state.

In one embodiment, the programmed state indicates that stored data is represented by a first set of threshold voltage distributions, and the overwritten state indicates that stored data is represented by a second set of threshold voltages distributions. The second set of threshold voltages distributions includes at least one threshold voltage distribution not in the first set of threshold distributions.

In a further embodiment of a method of managing a memory, the method includes overwriting a memory cell storing a first amount of data to store a second amount of data. The second amount of data is less than or equal to the first amount of data. A first set of read out voltages is for reading the first amount of data, and a second set of read out voltages is for reading the second amount of data. The second set of read out voltages includes at least one read out voltage higher than any of the read out voltages in the first set.

In one embodiment, a number of read out voltages in the second set of read out voltages is less than a number of read out voltages in the first set of read out voltages.

In another embodiment, a number of read out voltages in the second set of read out voltages is equal to a number of read out voltages in the first set of read out voltages.

Some example embodiments relate to a memory system.

In one embodiment, the memory system includes a memory and a controller. The memory includes at least one memory string, and the memory string includes a plurality of memory cells connected in series. The plurality of memory cells are arranged vertically with respect to a substrate, and the plurality of memory cells are divided into at least a first group of memory cells and a second group of memory cells. The first group of memory cells is disposed further from the substrate than the second group of memory cells. The controller is configured to program data into the plurality of memory cells based on a first set of threshold voltage distributions, and the controller is configured to overwrite data in memory cells of the first group based on a second set of threshold voltage distributions. An amount of overwritten data in a memory cell of the first group is less than or equal to an amount of programmed data. The second set of threshold voltage distributions includes at least one threshold voltage distribution not in the first set of threshold distributions.

In one embodiment, the controller is configured to not overwrite memory cells in the second group.

In one embodiment, the controller is configured overwrite data in memory cells of the second group based on a third set of threshold voltage distributions. An amount of overwritten data in a memory cell of the second group is less than or equal to an amount of programmed data. The third set of threshold voltage distributions includes at least one threshold voltage distribution not in the first set of threshold distributions.

In one embodiment, the third set of threshold distributions differs from the second set of threshold distributions.

In one embodiment, the controller is configured to overwrite the memory cells of the first group such that m-bit data is represented at least in part by threshold voltage distributions in at least two memory cells of the first group.

In one embodiment, the at least two memory cells of the first group include memory cells at different vertical locations within their respective memory strings.

In one embodiment, the memory includes a plurality of memory strings, and the memory cells of the plurality of memory strings are divided into blocks. The controller is configured to store state information for at least one of the blocks. The state information indicates one of a clean state, a programmed state, an invalid state, an overwritable state, and an overwritten state. The clean state indicates the block is erased, the programmed state indicates the block stores valid data, the invalid state indicates the block stores invalid data, the overwritable state indicates that overwriting of invalid data stored in the block without erasing the block is permitted, and the overwritten state indicates that at least a portion of the data stored in the block has been overwritten without erasing the block.

In one embodiment, the controller is configured to permit changing the state information for the block to the overwritable state only if a current state of the block is the invalid state.

In one embodiment, the controller is configured to overwrite data in the block only if the state information of the block indicates the overwritable state.

In one embodiment, the controller is configured to change the state information of the block to the overwritten state after overwriting of the block.

In one embodiment, the controller is configured to store an overwrite number if the state information indicates the overwritten state, the overwrite number indicating a number of times since the block was last erased.

In one embodiment, the controller is configured to store the state information in the memory. In one embodiment, the controller is configured to store the state information in a page of the block.

In one embodiment, the controller is configured to store the state information in the controller.

In one embodiment, the overwritten state indicates the block stores valid data.

In one embodiment, the overwritten state indicates the block stores less data per memory cell than stored during the programmed state.

Some example embodiments are also related to a non-transitory recording medium.

In one embodiment, the recording medium includes a storage area storing state information for at least one of the blocks. The state information indicates one of a clean state, a programmed state, an invalid state, an overwritable state, and an overwritten state. The clean state indicates the block is erased, the programmed state indicates the block stores valid data, the invalid state indicates the block stores invalid data, the overwritable state indicates that overwriting of invalid data stored in the block without erasing the block is permitted, and the overwritten state indicates that at least a portion of the data stored in the block has been overwritten without erasing the block.

In one embodiment, the storage area stores an overwrite number if the state information indicates the overwritten state, the overwrite number indicating a number of times since the block was last erased.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 25 is a table illustrating correlation between the number of extra states and erase frequency reduction when all cells of a block of a memory system have an extra state.

FIG. 26 is a table illustrating correlation between the number of extra states and erase frequency reduction when the half of cells of a block of a memory system has an extra state.

DETAILED DESCRIPTION

Figure 1:
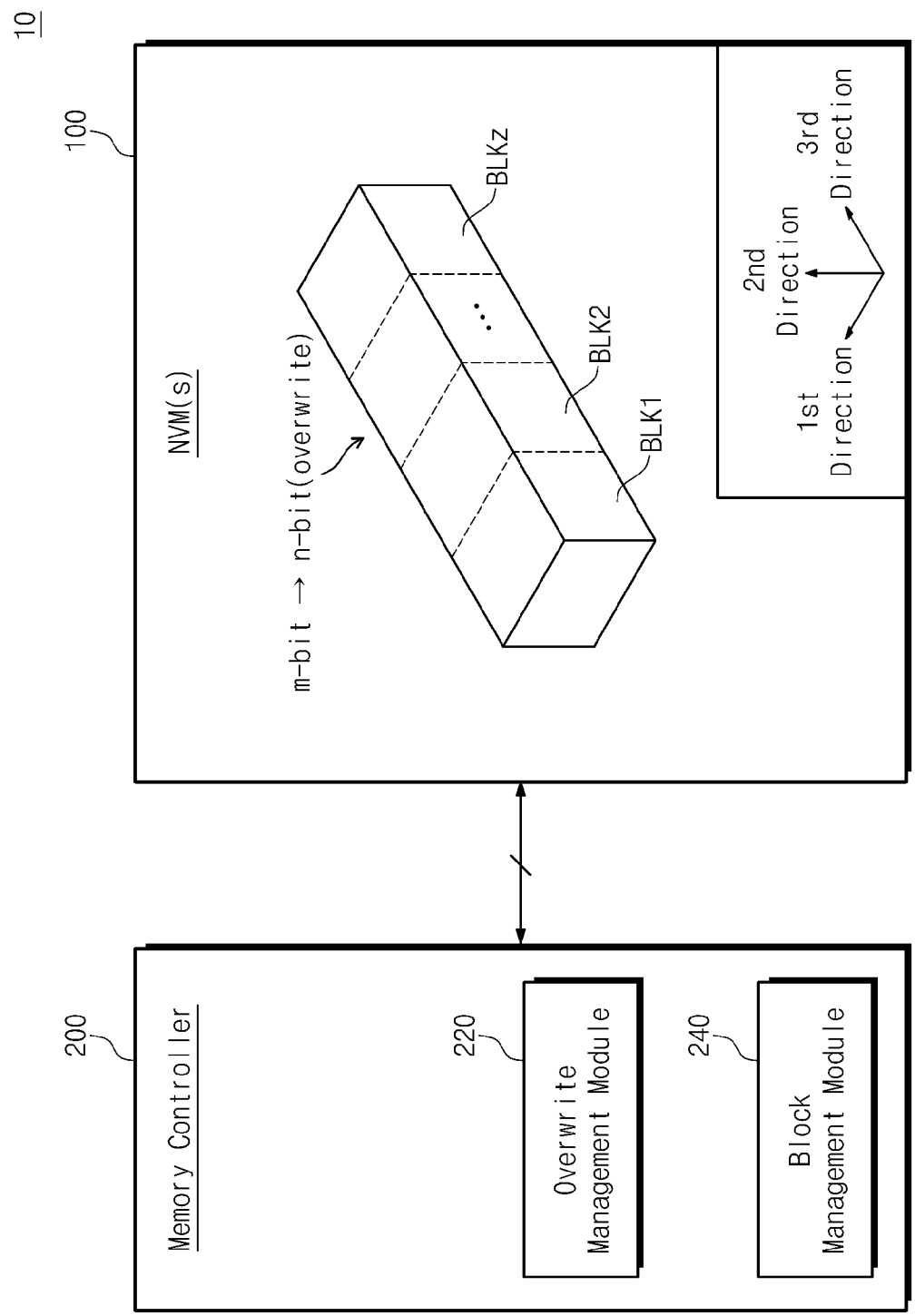
FIG. 1 is a block diagram illustrating a memory system according to an embodiment of the inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a memory system according to an embodiment of the inventive concepts. Referring to FIG. 1, a memory system 10 may include at least one nonvolatile memory device 100 and a memory controller 200 controlling the nonvolatile memory device 100.

The at least one nonvolatile memory device 100 according to an embodiment of the inventive concepts may be a NAND flash memory, a Vertical NAND (VNAND) flash memory, a NOR flash memory, a Resistive Random Access Memory (RRAM), a Phase-change RAM (PRAM), a Magnetoresistive RAM (MRAM), a Ferroelectric RAM (FRAM), a Spin Transfer Torque RAM (STT-RAM), or the like. Further, the nonvolatile memory device 100 according to an embodiment of the inventive concepts can be implemented to have a three-dimensional array structure. The inventive concepts are applicable to a flash memory device in which a charge storage layer is formed of a conductive floating gate, and a charge trap flash (CTF) memory in which a charge storage layer is formed of an insulation film Below, for ease of description, a nonvolatile memory device 100 may be assumed to be a Vertical NAND (VNAND) flash memory device having a three-dimensional array structure.

The nonvolatile memory device 100 may include a plurality of memory blocks BLK1 to BLKz each of which extends in a direction (a second direction) perpendicular to a substrate. Herein, the substrate may be formed in first and third directions. Herein the first to third directions may be orthogonal to one another. Each of the memory blocks BLK1 to BLKz may include a plurality of sub blocks (not shown). The sub blocks may have different structural properties or electrical properties.

Each of the memory blocks BLK1 to BLKz may include at least one string having a plurality of memory cells that are formed by stacking at least one string selection line, a plurality of word line, and at least one ground selection line in a perpendicular direction to the substrate. Herein, each memory cell may be connected to a corresponding bit line and stores at least one bit, respectively.

As for at least one of the memory cells, an m-bit program operation (m being a natural number) may be performed, and then an n-bit program operation (n being a real number) may be executed through an overwrite operation. Herein, the overwrite operation includes programming a prior state programmed at the m-bit program operation to have at least one extra state that has a higher threshold voltage distribution than the prior state. M-bit data defined by the prior state becomes invalid after performing the n-bit program operation through the overwrite operation. That is to say, n-bit data stored in the memory cell having experienced the n-bit program operation after the m-bit program operation stores data that is valid.

In example embodiments, the number of the prior state programmed by the m-bit program operation is $2^m$ and n may be less than m.

In other example embodiments, n may be equal to or less than m. In still other embodiment n maybe equal to or more than m.

An VNAND in which upper memory cells connected to upper word lines have more program states than lower memory cells connected to lower word lines is disclosed in KR Patent application No. 10-2011-0037961 filed (U.S. Ser. No. 13/413,118), the entirety of which is herein incorporated by reference. The VNAND shown in the above application may have more capacity than a normal VNAND having the same program states in memory cells.

Further and more detailed description of the memory blocks BLK1 to BLKz is disclosed in U.S. Patent Publication Nos. 2009/0310415, 2010/0078701, 2010/0117141, 2010/0140685, 2010/02135527, 2010/0224929, 2010/0315875, 2010/0322000, 2011/0013458, and 2011/0018036, the entirety of each of which is herein incorporated by reference.

The memory controller 200 may control an overall operation of the nonvolatile memory device 100 such as a program operation, a read operation, and an erase operation. The memory controller 200 may include an overwrite management module 220 and a block management module 240.

The overwrite management module 220 may manage execution of an overwrite operation. In example embodiments, the overwrite management module 220 manages execution of the overwrite operation by the unit of block, sub-block or page. For example, the overwrite management module 220 may judge execution of an overwrite operation on each memory block and manage an overwrite number of each memory block when an overwrite operation is executed. For instance, the overwrite management module 220 may judge whether an overwrite operation can be performed on one of the memory blocks BLK1 to BLKz. When an overwrite operation is possible on a block, the overwrite management module 220 may perform a program operation on the block through an overwrite operation and update and store an overwrite number corresponding to the overwritten memory block. Herein, whether to do execution of the overwrite operation may be determined according to a state (e.g., a data state or a healthy state) of a block associated with the erase possibility. That is, a block that is applicable to an overwrite operation stores data which is invalidated by firmware operating on the memory controller.

In example embodiments, whether to do execution of the overwrite operation may be determined according to a data state of each memory block. For example, an overwrite operation on a memory block may be executed when data stored in the memory block is invalid data or when the number of invalid pages in the memory block is over a reference value.

In other example embodiments, whether to do execution of the overwrite operation may be determined according to a health state of each memory block. For example, an overwrite operation on a memory block may be executed when a program/erase cycle number of the memory block is under a reference value.

In example embodiments, the overwrite management module 220 may manage an overwrite number by the block, the sub-block, or the page of block.

The block management module 240 may manage the memory blocks BLK1 to BLKz based on the overwrite number. For example, the block management module 240 may erase a memory block when an overwrite number of the memory block is over a reference value.

A conventional memory system may be configured to erase a memory block according to a data state or a program/erase cycle number. On the other hand, the memory system 10 of the inventive concepts may be configured to determine an overwrite operation prior to an erase operation and to then erase a memory block based on an overwrite number. Compared with the conventional memory system, the memory system 10 of the inventive concepts may reduce the number of erase operations of a memory block. Thus, the memory system 10 of the inventive concepts may improve the reliability associated with an erase operation.

The memory system 10 of the inventive concepts may reduce an incremental step pulse erase (ISPE) cycle number which is needed to reach an erase state by performing an overwrite operation prior to the erase operation.

Figure 2:
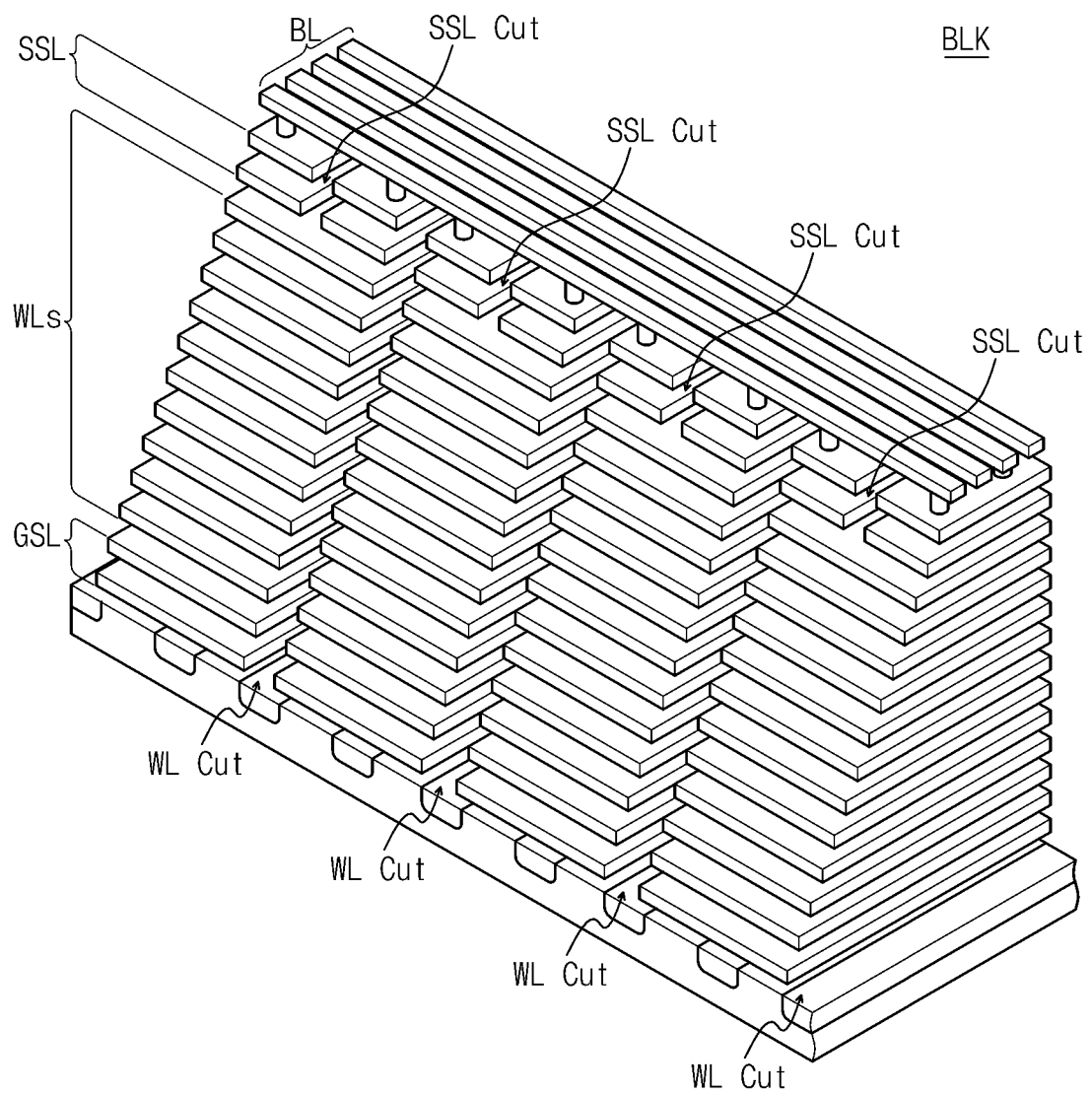
FIG. 2 is a diagram illustrating a memory block in FIG. 1 according to an embodiment of the inventive concepts.

FIG. 2 shows a memory block in FIG. 1 according to an embodiment of the inventive concepts. Referring to FIG. 2, a memory block including four sub-blocks may be formed on a substrate. Each of the sub-blocks may be formed by stacking at least one ground selection line GSL, a plurality of word lines WL, and at least one string selection line SSL on the substrate successively and separating a resultant structure by word line cuts WL Cut. Although not illustrated in FIG. 2, each of the word line cuts WL Cut may include a common source line CSL. Common source lines included in the word line cuts WL Cut may be connected commonly to neighboring sub-blocks.

Figure 5:
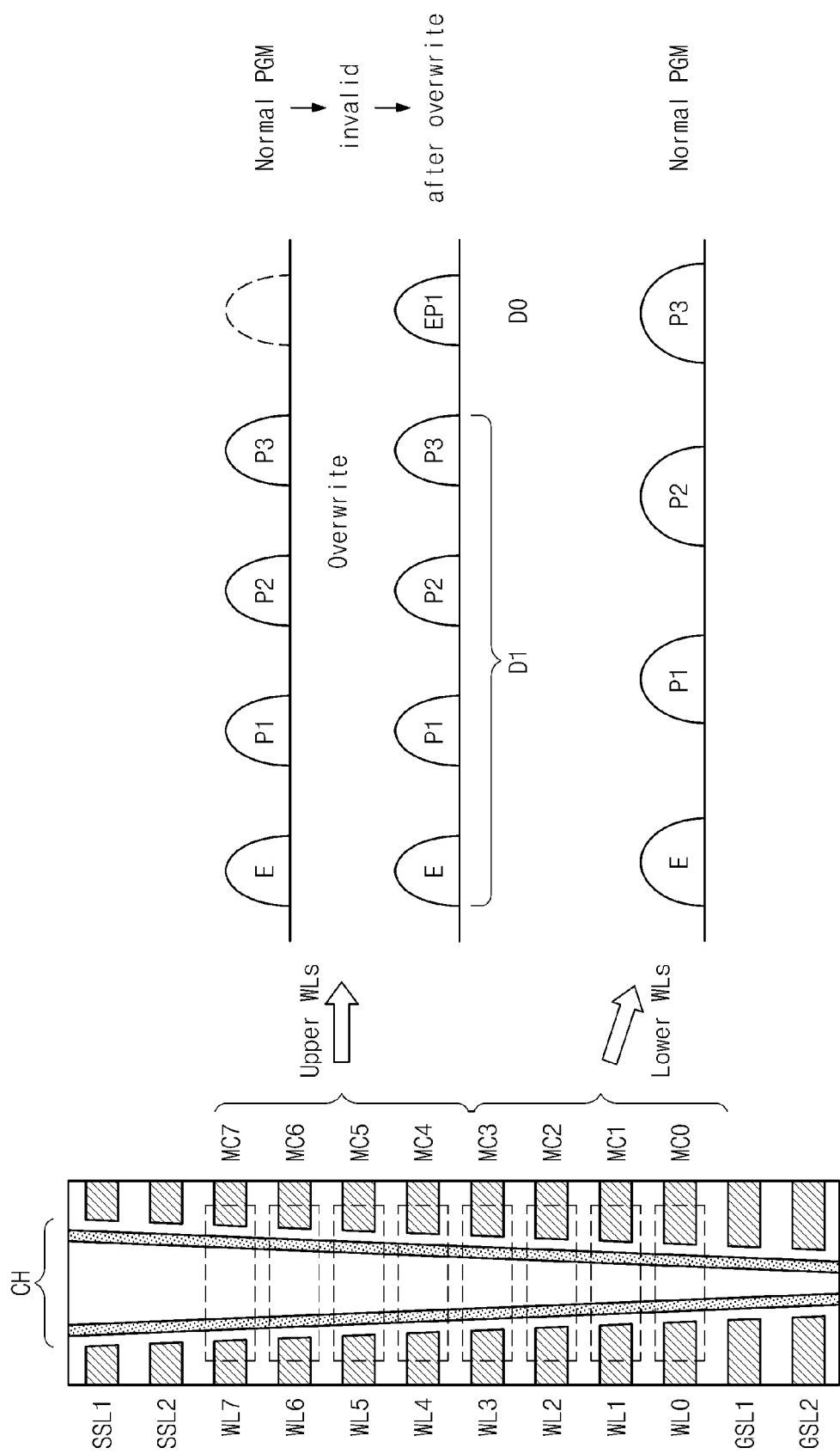
FIG. 5 is a conceptual diagram illustrating how a memory block is overwritten.

In FIG. 2, a structure between word line cuts may be referred to as a sub-block. However, the inventive concepts are not limited thereto. A structure between a word line cut and a string selection line cut can be referred to as a sub block. Also, the plurality of word lines between the SSL and the GSL may be divided into sub-blocks in a block. In FIG. 5, MC4 through MC7 connected to upper word lines WL4 to WL7 and MC0 to MC3 connected to lower word line WL0 to WL3 may be a different sub-block respectively.

A memory block according to an embodiment of the inventive concepts may be configured such that two word lines in one layer between two word line cuts are merged to one. In other words, the memory block according to an embodiment of the inventive concepts may be configured to a merged word line structure.

Figure 3:
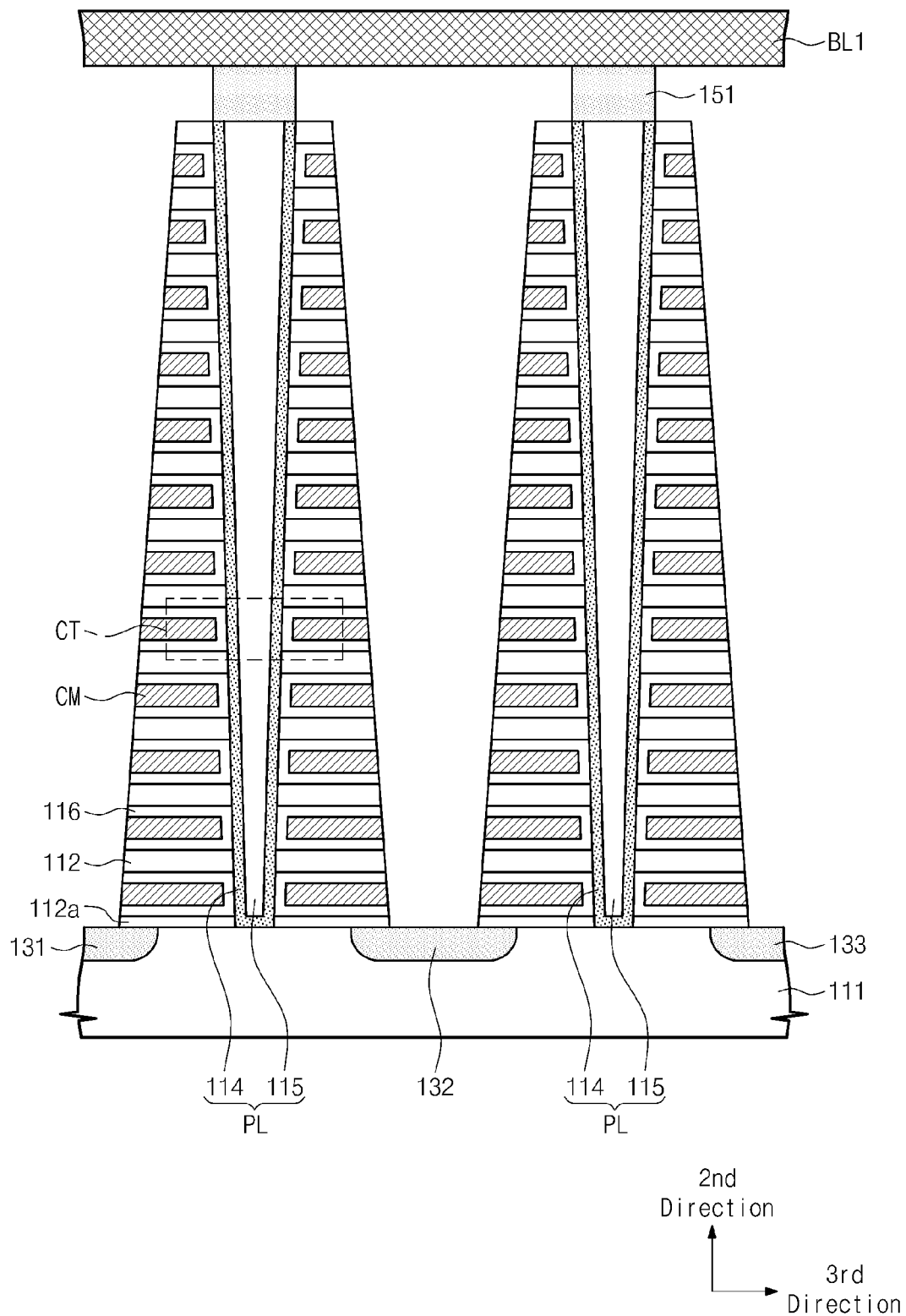
FIG. 3 is a cross-sectional view of a memory block in FIG. 2 according to an embodiment of the inventive concepts.

FIG. 3 is a cross-sectional view of a memory block in FIG. 2 according to an embodiment of the inventive concepts. Referring to FIG. 3, a semiconductor substrate 111 may be provided. The semiconductor substrate 111 may be a well having a first conductivity type, for example. The semiconductor substrate 111 may be a p-well in which the Group III element such as boron is injected. The semiconductor substrate 111 may be a pocket p-well which is provided within an n-well. Hereinafter, it is assumed that the semiconductor substrate 111 is a p-well (or, a pocket p-well). However, the semiconductor substrate 111 is not limited to p-type.

A plurality of doping regions 131 to 133 extending along the first direction may be provided in the substrate 111. The doping regions 131 to 133 may be spaced apart from one another along a third direction. Hereinafter, the doping regions 131 to 133 may be referred to as a first doping region 131, a second doping region 132, and a third doping region 133, respectively.

The first to third doping regions 131 to 133 may have a second conductivity type different from the substrate 111. For example, the first to third doping regions 131 to 133 may be n-type. Hereinafter, it is assumed that the first to third doping regions 131 to 133 are n-type. However, the doping regions 131 to 133 are not limited to the n-type.

Between two adjacent regions of the first to third doping regions 131 to 133, a plurality of insulation materials 112 and 112a may be provided sequentially on the substrate 111 along a second direction (i.e., a direction perpendicular to the substrate 111). The insulation materials 112 and 112a may be spaced apart along the second direction. The insulation materials 112 and 112a may extend along a first direction. For example, the insulation materials 112 and 112a may include an insulation material such as a silicon oxide film. The insulation material 112a contacting with the substrate 111 may be thinner in thickness than other insulation materials 112.

Between two adjacent regions of the first to third doping regions 131 to 133, a plurality of pillars PL may be arranged sequentially along the first direction so as to penetrate the plurality of insulation materials 112 and 112a along the second direction. For example, the pillars PL may contact with the substrate 111 to penetrate the insulation materials 112 and 112a.

In example embodiments, the pillars PL may be formed of a plurality of layers, respectively. Each of the pillars PL may include a channel film 114 and an inner material 115. In each of the pillars PL, the channel film 114 may be formed to surround the inner material 115.

The channel films 114 may include a semiconductor material (e.g., silicon) having a first conductivity type. For example, the channel films 114 may include a semiconductor material (e.g., silicon) having the same type as the substrate 111. Below, it is assumed that the channel films 114 include p-type silicon. However, the inventive concepts are not limited thereto. For example, the channel films 114 can include intrinsic semiconductor being a nonconductor.

The inner materials 115 may include an insulation material. For example, the inner materials 115 may include an insulation material such as silicon oxide. Alternatively, the inner materials 115 may include air gap.

Between two adjacent regions of the first to third doping regions 131 to 133, information storage films 116 may be provided on exposed surfaces of the insulation materials 112 and 112a and the pillars PL. In example embodiments, a thickness of the information storage film 116 may be smaller than a distance between the insulation materials 112 and 112a. A width of the information storage film 116 may be in inverse proportion to a depth of a pillar. For example, the deeper the pillar PL as measured from a drain 151, the wider the width of the information storage film 116.

Between two adjacent regions of the first to third doping regions 131 to 133, and between the insulation materials 112 and 112a, conductive materials CM may be provided on exposed surfaces of the information storage films 116. A conductive material CM may be provided between an information storage film provided on a lower surface of an upper insulation material of the insulation materials 112 and 112a and an information storage film 16 provided on an upper surface of a lower insulation material thereof. In example embodiments, the conductive materials CM may include a metallic conductive material. The conductive materials CM may include a nonmetallic conductive material such as polysilicon.

In example embodiments, information storage films 116 provided on an upper surface of an insulation material placed at the uppermost layer from among the insulation materials 112 and 112a can be removed. In example embodiments, information storage films 116 provided at sides opposite to the pillars PL from among sides of the insulation materials 112 and 112a can be removed.

A plurality of drains 151 may be provided on the plurality of pillars PL. The drains 151 may include a semiconductor material (e.g., silicon) having a second conductivity type, for example. The drains 151 may include an n-type semiconductor material (e.g., silicon). Below, it is assumed that the drains 151 include n-type silicon. However, the inventive concepts are not limited thereto. The drains 151 can be extended to the upside of the channel films 114 of the pillars PL.

Bit lines BL extending in the second direction may be provided on the drains 151 so as to be spaced apart from one another along the first direction. The bit lines BL may be coupled with the drains 151. In example embodiments, the drains 151 and the bit lines BL may be connected via contact plugs (not shown). The bit lines BL may include a metallic conductive material. Alternatively, the bit lines BL may include a nonmetallic conductive material such as polysilicon.

The plurality of pillars PL may form vertical strings together with the information storage films 116 and the plurality of conductive materials. Each of the pillars PL may form a vertical string with information storage films 116 and adjacent conductive materials.

Each of the vertical strings may include a plurality of cell transistors (or, memory cells) stacked in a vertical direction to the substrate 111. In FIG. 3, a dotted box CT may indicate one cell transistor.

Figure 4:
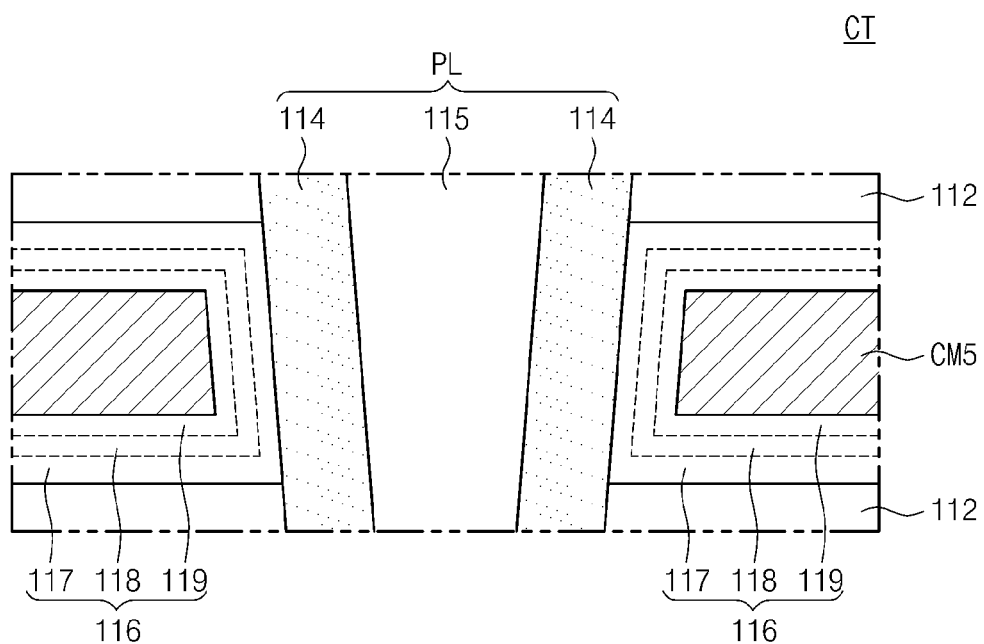
FIG. 4 is an enlarged diagram illustrating one of cell transistors in FIG. 3.

FIG. 4 is an enlarged diagram illustrating one of cell transistors in FIG. 3. Referring to FIGS. 3 and 4, a cell transistor CT may be formed of a conductive material CM5, a pillar PL adjacent to the conductive material CM5, and information storage films 116 provided between the conductive material CM5 and the pillar PL.

The information storage films 116 may extend to upper surfaces and lower surfaces of the conductive materials CM from regions between the conductive materials CM and the pillar PL. Each of the information storage films 116 may include first to third sub insulation films 117, 118, and 119. In the cell transistors CT, channel films 114 of the pillar PL may include the same p-type silicon as a substrate 111.

The channel film 114 may act as a body of the cell transistors CT. The channel film 114 may be formed in a direction perpendicular to the substrate 111. Thus, the channel film 114 of the pillars PL may act as a vertical body of the channel film 114. Channels formed at the channel film 114 of the pillar PL may act as vertical channels.

The conductive materials CM may act as gates (or, control gates). The first sub insulation films 117 adjacent to the pillars PL may act as tunneling insulation films. For example, the first sub insulation films 117 adjacent to the pillar PL may include a thermal oxide film, respectively. The first sub insulation films 117 may include a silicon oxide film, respectively.

The second sub insulation films 118 may act as charge storage films. For example, the second sub insulation films 118 may act as a charge trap film, respectively. For example, the second sub insulation films 118 may include a nitride film or a metal oxide film (e.g., an aluminum oxide film, a hafnium oxide film, etc.), respectively. The second sub insulation films 118 may include a silicon nitride film.

The third sub insulation films 119 adjacent to the conductive materials may act as blocking insulation films. In example embodiments, the third sub insulation films 119 may be formed of a single layer or multiple layers. The third sub insulation films 119 may be a high dielectric film (e.g., an aluminum oxide film, a hafnium oxide film, etc.) having a dielectric constant larger than those of the first and second sub insulation films 117 and 118. The third sub insulation films 119 may include a silicon oxide film, respectively.

In example embodiments, the first to third sub insulation films 117 to 119 may constitute ONO (oxide-nitride-oxide). That is, the plurality of conductive materials CM acting as gates (or, control gates), the third sub insulation films 119 acting as block insulation films, the second sub insulation films 118 acting as charge storage films, the first sub insulation films 117 acting as tunneling insulation films, and the channel films 114 acting as vertical bodies may constitute a plurality of cell transistors CT stacked in a direction perpendicular to the substrate 111. Exemplarily, the cell transistors CT may be a charge trap type cell transistor.

The conductive materials may extend along the first direction to be connected with the plurality of pillars PL. The conductive materials may constitute conductive lines interconnecting cell transistors CT of the pillars PL in the same row. In example embodiments, the conductive materials CM may also be used as a string selection line, a ground selection line, or a word line according to the height.

FIG. 5 is a conceptual diagram illustrating how to perform an overwrite operation for VNAND. Referring to FIG. 5, a diameter of a channel hole CH (or, a pillar) gets narrower as it become deeper. That is, a charge storage area of memory cells connected with lower word lines may be narrower than that of memory cells connected to upper word lines. When a program operation is executed under the condition that the same voltage is applied to all word lines WL0 to WL7, strengths of electric fields generated at memory cells MC0 to MC7 may be different from one another. This may mean that the amount of charges stored at respective charge storage films is different. As illustrated in FIG. 5, the width of threshold voltage distributions of each program state of memory cells connected to upper word lines is narrower than the width of threshold voltage distributions of each program state of memory cells connected to lower word lines.

The number of program states in the same threshold voltage window range depends on how wide is the threshold voltage distribution of each program state. The threshold voltage distribution of each program state may be determined according to locations of word lines in a vertical string. For example, each of memory cells MC4 to MC7 connected to upper word lines WL4 to WL7 may be one of five states E, P1, P2, P3, and EP1 after an overwrite operation. Each of memory cells MC0 to MC3 connected to lower word lines WL0 to WL3 may have one of four states E, P1, P2, and P3 after a normal program operation. Herein, each of the memory cells MC4 to MC7 may be programed to have an extra state EP1 according to data through an overwrite operation.

As illustrated in FIG. 5, first, an m-bit program operation (e.g., a 2-bit program operation) may be executed on memory cells connected to all word lines WL0 to WL7. After the m-bit program operation is performed, an n-bit program operation (e.g., 1-bit program operation in FIG. 5) may be further executed on memory cells connected to the upper word lines WL4 to WL7 through an overwrite operation.

In example embodiments, the number of overwrite operations applicable to memory cells connected to the upper word lines WL4 to WL7 may be different from that applicable to memory cells connected to the lower word lines WL0 to WL3. For example, the number of overwrite operation applicable to memory cells connected to the upper word lines WL4 to WL7 may be '1', while the memory cells connected to the lower word lines WL0 to WL3 may not be overwritten. This may be controlled by the memory controller 200.

In example embodiments, if the voltage window range for threshold voltage distribution of program states is wide enough, a single level cell (SLC) program operation as a second overwrite operation may be further executed on memory cells which are already programmed through the first overwrite operation. Eight word lines WL0 to WL7 are illustrated in FIG. 5. However, the inventive concepts are not limited thereto. Four upper word lines WL4 to WL7 are illustrated in FIG. 5. However, the inventive concepts are not limited thereto. One extra state EP1 are illustrated in FIG. 5. However, the inventive concepts are not limited thereto. For example, two or more extra states can be used for an overwrite operation(s).

The inventive concepts may perform an overwrite operation in which memory cells are programmed to have different state numbers according to a word line location in a vertical string.

The memory cells connected to the upper word lines and the memory cells connected to the lower word lines are assigned as upper blocks and lower blocks, respectively, and are each erasable independently from one another. In a memory system including a VNAND and a memory controller controlling overall operation of the VNAND, the overwrite operation may be performed after an upper block is invalidated by a flash translation layer (FTL) executing on the memory controller.

Figure 6:
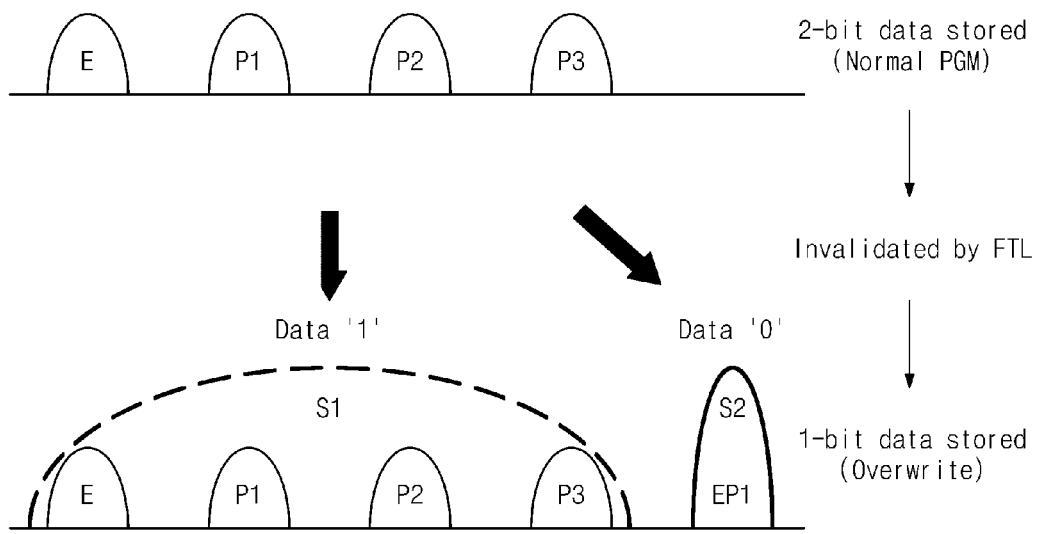
FIG. 6 is a diagram illustrating an overwrite operation according to an embodiment of the inventive concepts.

FIG. 6 is a diagram illustrating an overwrite operation according to an embodiment of the inventive concepts. Referring to FIGS. 5 and 6, a memory cell (e.g., one of MC4 to MC7 in FIG. 5) may be programmed to be in a first state S1 such as a prior state (one of E, P1, P2, and P3) of normal program operation or a second state S2 such as to an extra state EP1 shifted from a prior state (one of E, P1, P2, and P3) according to the value of data being programmed by the overwrite operation. Herein, the first state S1 may correspond to data '1' and the second state S2 may correspond to data '0' and vice versa.

As illustrated in FIG. 6, a multi-level cell having one of four states E, P1, P2, and P3 may become a single level cell having one of two states S1 and S2 through an overwrite operation. That is, a memory cell storing 2 bits indicated by one of four states E, P1, P2, and P3 may be changed to a memory cell storing 1 bit indicated by one of two states S1 and S2 after an overwrite operation In FIG. 6, the first state S1 may be the same as a prior state (one of E, P1, P2, and P3). That is, during an overwrite operation, memory cells to be programmed data '1' and having a prior state (one of E, P1, P2, and P3) may be inhibited from being programed. For example, a bias voltage of a program inhibition condition (e.g., a power supply voltage) may be provided to bit lines corresponding to program-inhibited memory cells. However, the inventive concepts are not limited thereto. The first state S1 can be formed by reprogramming not to exceed a desired (or, alternatively a predetermined) threshold voltage.

Figure 7:
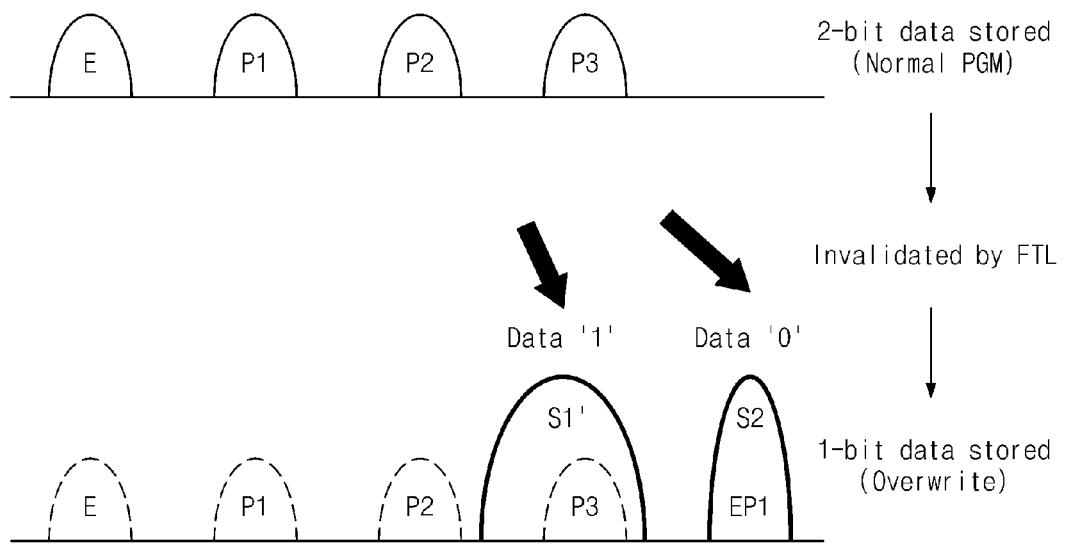
FIG. 7 is a diagram illustrating an overwrite operation according to another embodiment of the inventive concepts.

FIG. 7 is a diagram illustrating an overwrite operation according to another embodiment of the inventive concepts. Referring to FIGS. 5 and 7, during an overwrite operation, a memory cell (one of E, P1, P2, and P3) may be programmed to have a first state S1' shifted from prior states (E, P1, P2, and P3) (or, gathered by programming the prior states (E, P1, P2, and P3)) or a second state S2 being an extra state EP1 shifted from a prior state (one of E, P1, P2, and P3) according to the value of programmed data. Herein, the first state S1' may correspond to data '1' and the second state S2 may correspond to data '0' after an overwrite operation.

In example embodiments, the first state S1' may include the uppermost state S3 as illustrated in FIG. 7.

As illustrated in FIG. 7, a multi-level cell having one of four states E, P1, P2, and P3 may become a single level cell having one of two states S1' and S2 through an overwrite operation. That is, a memory cell storing 2 bits indicated by one of four states may be changed to a memory cell storing 1 bit indicated by one of two states S1' and S2 after an overwrite program operation.

With the above-described overwrite operation, as illustrated in FIG. 7, prior states E, P1, P2, and P3 may shift into the first state S1' or the second state S2 according to data to be programmed by the overwrite operation. The threshold voltage distribution of the first state S1' in FIG. 7 is narrower than the width of the threshold voltage distribution of the first state S1 in FIG. 6. The narrow threshold voltage distribution including the first state S1' and the second state S2 may be advantageous to an erase operation. Compared with a memory block not overwritten, when an overwritten memory block is erased, threshold voltage distribution or the number of an ISPE cycles may be reduced.

As described with reference to FIGS. 5 to 7, after a 2-bit program operation is executed, a 1-bit program operation may be executed through an overwrite operation. However, the inventive concepts are not limited thereto. For example, after a 3-bit program operation is executed, a 1-bit program operation may be executed through an overwrite operation.

Figure 8:
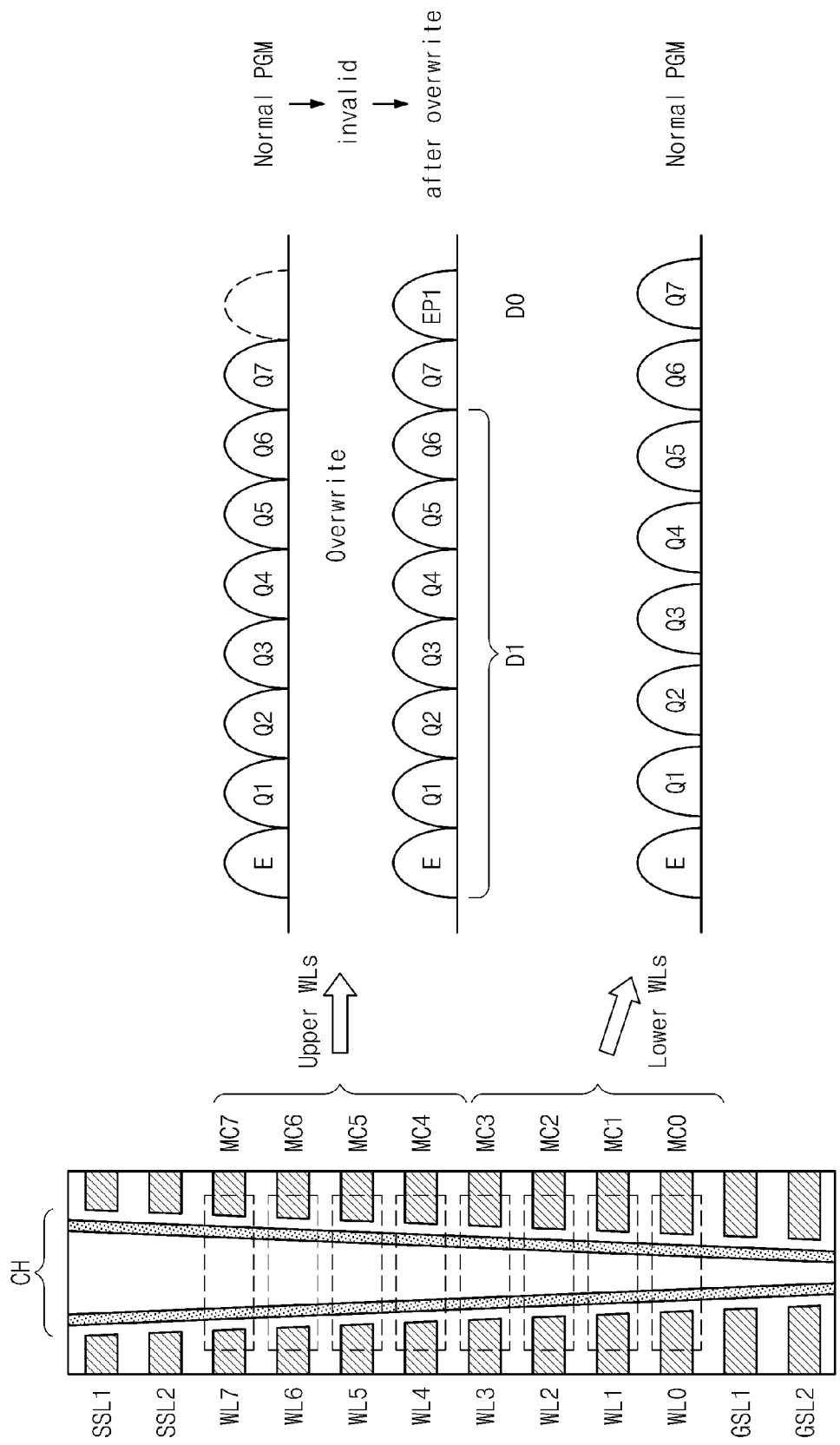
FIG. 8 is a diagram illustrating an overwrite operation executed following a 3-bit program operation according to an embodiment of the inventive concepts.

FIG. 8 is a diagram illustrating an overwrite operation executed following a 3-bit program operation according to an embodiment of the inventive concepts. Referring to FIG. 8, memory cells MC4 to MC7 connected to upper word lines WL4 to WL7 may be programmed to have one of nine states E, Q1 to Q7, and EP1, and memory cells MC0 to MC3 connected to lower word lines WL0 to WL3 may be programmed to have one of eight states E and Q1 to Q7. Herein, each of the memory cells MC4 to MC7 connected to the upper word lines WL4 to WL7 can be programmed to have the state EP1 through an overwrite operation.

Figure 9:
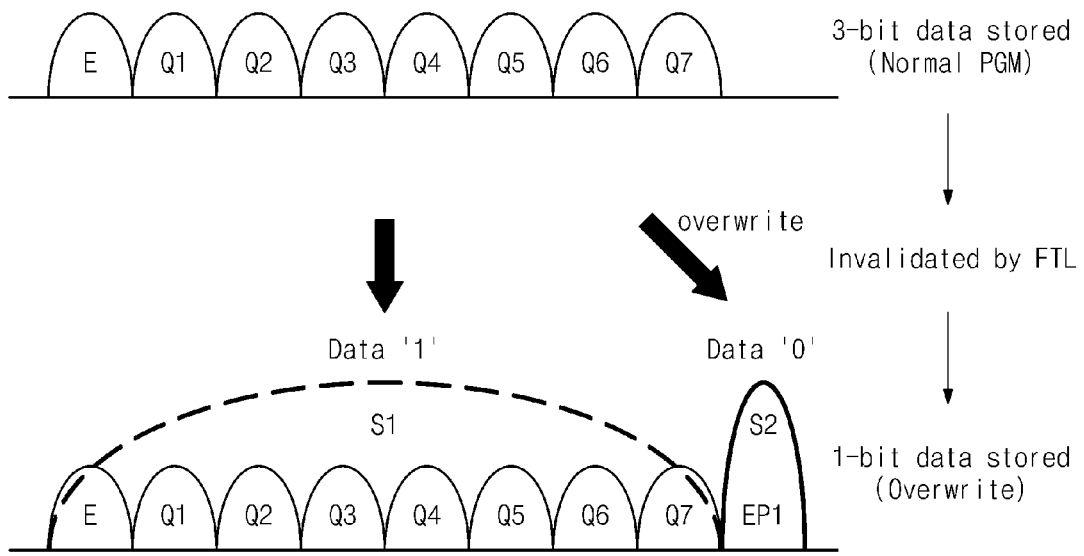
FIG. 9 is a diagram illustrating an overwrite operation in FIG. 8 according to an embodiment of the inventive concepts.

FIG. 9 is a diagram illustrating an overwrite operation in FIG. 8 according to an embodiment of the inventive concepts. Referring to FIGS. 8 and 9, at an overwrite operation, a memory cell (one of MC4, MC5, MC6, and MC7 in FIG. 8) may be programmed to have one of a first state S1, which maintains a prior state (one of Q1 to Q7), and a second state S2 being an extra state EP1 shifted from a prior state (shifted from one of Q1 to Q7). Herein, the first state S1 may correspond to data '1' and the second state S2 may correspond to data '0'.

Figure 10:
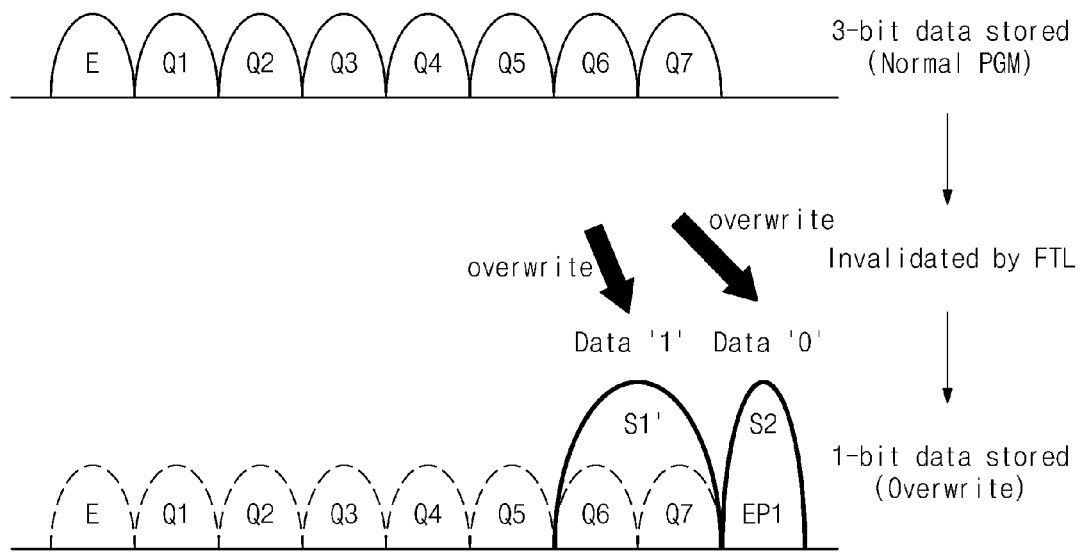
FIG. 10 is a diagram illustrating an overwrite operation in FIG. 8 according to another embodiment of the inventive concepts.

FIG. 10 is a diagram illustrating an overwrite operation in FIG. 8 according to another embodiment of the inventive concepts. Referring to FIGS. 8 and 10, at an overwrite operation, a memory cell (one of MC4, MC5, MC6, and MC7 in FIG. 8) may be programmed to have a first state S1' shifted from prior states (Q1 to Q7) (or, gathered by programming the prior states (Q1 to Q7)) and a second state S2 being an extra state EP1 shifted from a prior state (one of Q1 to Q7). Herein, the first state S1' may correspond to data '1' and the second state S2 may correspond to data '0'.

As described with reference to FIGS. 8 to 10, after a 3-bit program operation is executed, a 1-bit program operation may be executed through an overwrite operation.

After a multi-bit program operation of a memory block is executed, a single-bit program operation may be performed through an overwrite operation. However, the inventive concepts are not limited thereto. After a multi-bit program operation is executed, a program operation can be performed in a multi-dimension modulation scheme through an overwrite operation. Herein, the multi-dimension modulation scheme means that a data value to be stored is encoded and the encoded result is programmed into a desired (or, alternatively a predetermined) number of memory cells. The multi-dimension modulation scheme is disclosed in KR Patent application No. 10-2011-0037961(U.S. Ser. No. 13/413,118), the entirety of which is herein incorporated herein by reference.

Figure 11:
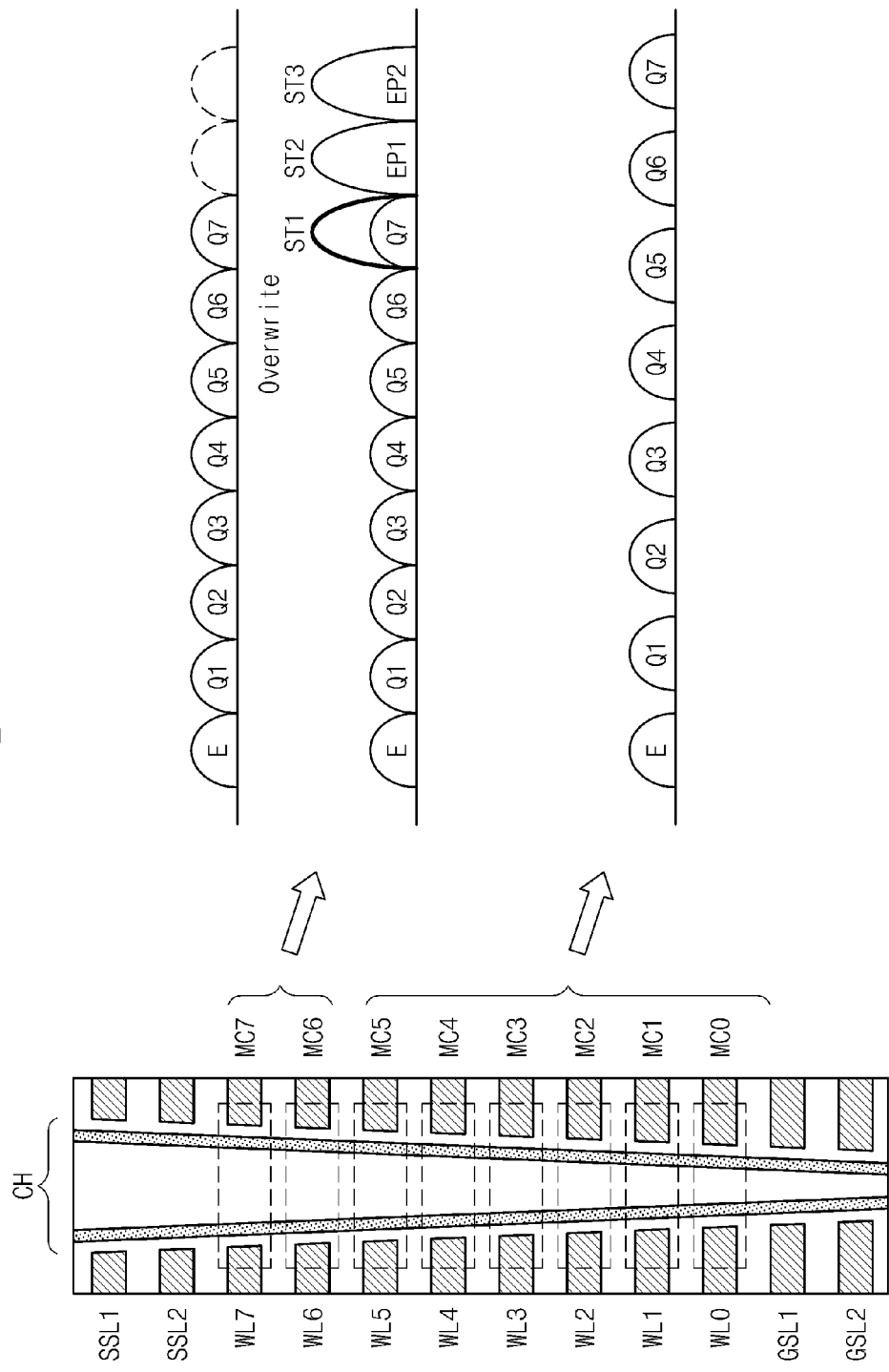
FIG. 11 is a diagram illustrating a program operation executed in a multi-dimension modulation scheme through an overwrite operation after a 3-bit program operation.

FIG. 11 is a diagram illustrating a program operation executed in a multi-dimension modulation scheme through an overwrite operation after a 3-bit program operation. Referring to FIG. 11, memory cells MC6 and MC7 connected to upper word lines WL6 and WL7 may be programmed to have one of first to third states ST1, ST2, and ST3. That is, memory cells may be programmed to have three states ST1, ST2, and ST3 through an overwrite operation.

Figure 12:
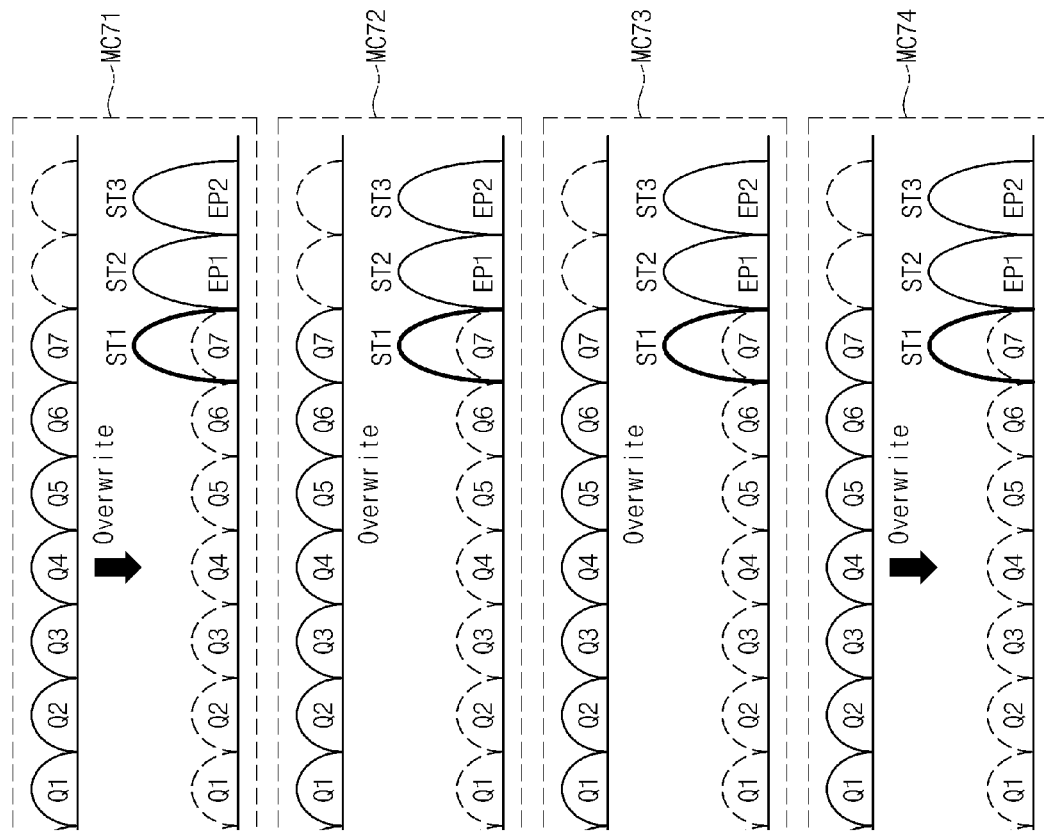
FIG. 12 is a diagram illustrating a program operation in FIG. 11 according to an embodiment of the inventive concepts.

FIG. 12 is a diagram illustrating a program operation in FIG. 11 according to an embodiment of the inventive concepts. Referring to FIG. 12, an overwrite operation may program a data value to be stored at four memory cells MC71, MC72, MC73, and MC74 that are continuously neighboring. 81 states (3×3×3×3) may be used by a unit of four cells according to a programmed state of the continuous memory cells MC71, MC72, MC73, and MC74. Herein, the 81 states may appropriately correspond to data values to be programmed.

Figure 13:
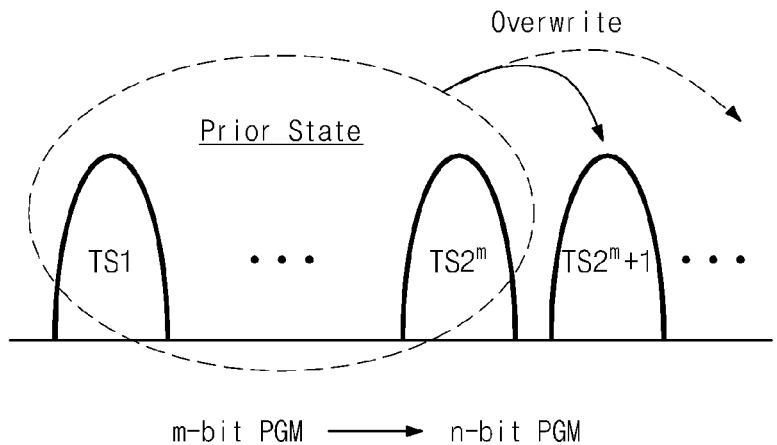
FIG. 13 is a conceptual diagram schematically illustrating a program method according to an embodiment of the inventive concepts.

FIG. 13 is a conceptual diagram schematically illustrating a program method according to an embodiment of the inventive concepts. Referring to FIG. 13, with a program method of the inventive concepts, after an m-bit program operation (m being a natural number) is executed, an n-bit program operation (n being a real number) may be performed through an overwrite operation.

The m-bit program operation may be performed using $2^m$ states TS1 to TS$2^m$. After the m-bit program operation, the n-bit program operation may be performed using at least one extra state TS$2^m+1$ when an overwrite operation is required (or, when an overwrite condition is satisfied).

In example embodiments, the overwrite condition (or, condition for the overwrite operation) may be managed by the block. For example, the number of clean blocks (or, free blocks), in which data is not stored, from among blocks may be used for the overwrite condition.

In example embodiments, the overwrite condition may be managed by the sub-block. For example, the number of sub-blocks, having invalid data, from among sub-blocks may be used for the overwrite condition.

In example embodiments, the overwrite condition may be managed by the page. For example, the number of invalid page may be used for the overwrite condition.

In example embodiments, n may be less than m. In another embodiment, n may be less than or equal to m.

In other example embodiments, n may be equal to or more than m.

The program method of the inventive concepts may include performing an overwrite operation in which an m-bit programmed prior state is shifted into at least one extra state, which has a higher threshold voltage than the prior state. As a result of the overwrite operation, the data defined by the prior states becomes invalid and the data programmed by the overwrite operation is valid.

With the program method of the inventive concepts, after an n-bit program operation is executed through an overwrite operation, an overwrite operation may be executed once more. This may depend on the width of threshold voltage distribution of each programmed state after m-bit program operation and the threshold voltage window for possible program states.

Figure 14:
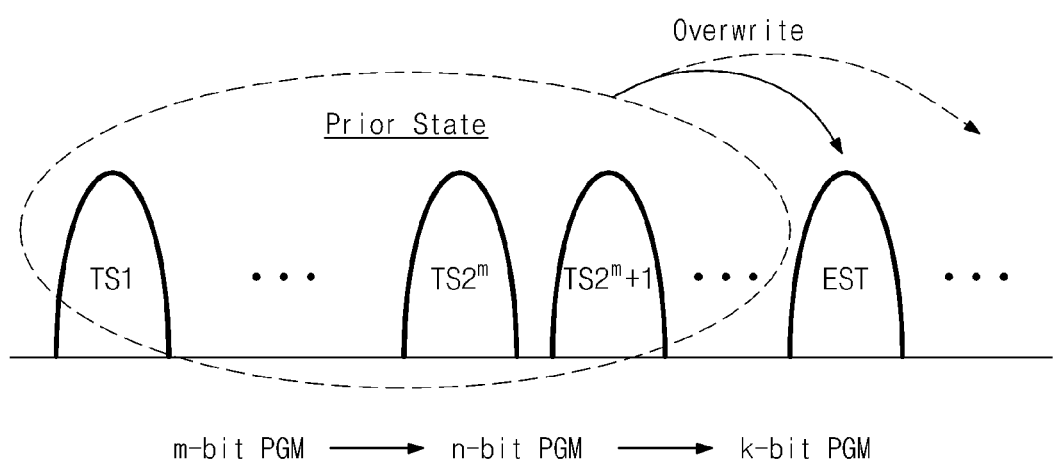
FIG. 14 is a conceptual diagram schematically illustrating a program method according to another embodiment of the inventive concepts.

FIG. 14 is a conceptual diagram schematically illustrating a program method according to another embodiment of the inventive concepts. Referring to FIG. 14, an n-bit program operation (n being a read number) may be executed through a first overwrite operation, and a k-bit program operation (k being a positive real number) may be performed once more through a second overwrite operation. With the program method of the inventive concepts, a prior state of n-bit programmed through the first overwrite operation may be programmed to have at least one extra state EST, which has a higher threshold voltage than the prior state, through the second overwrite operation. In example embodiments, k may be less than n. In other example embodiments, k may be less than or equal to n. In still other example embodiments, k may be more than n.

The m-bit program operation may be performed using $2^m$ states TS1 to TS$2^m$. However, the inventive concepts are not limited thereto. A program operation before an overwrite operation may be executed using a plurality of states before an overwrite operation.

Figure 15:
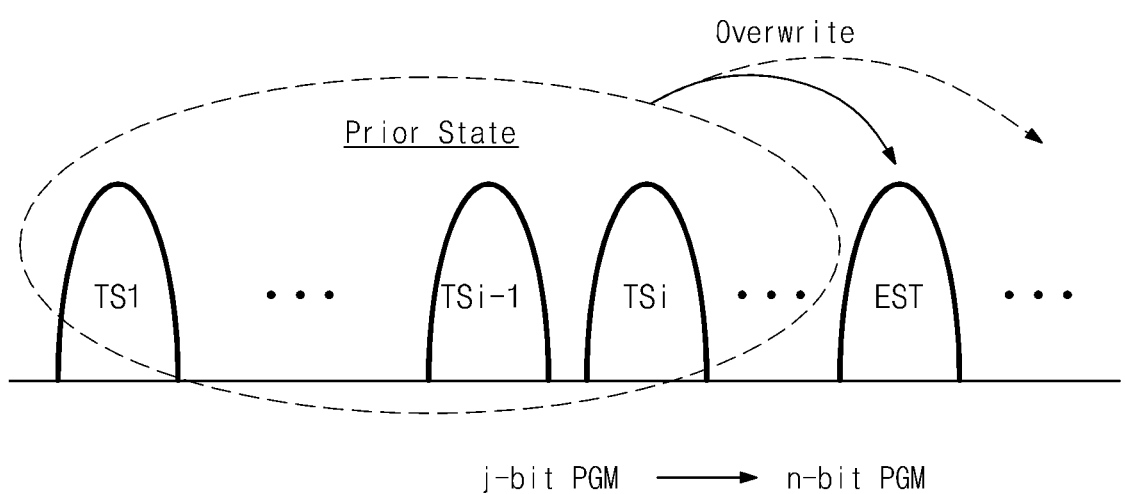
FIG. 15 is a conceptual diagram schematically illustrating a program method according to still another embodiment of the inventive concepts.

FIG. 15 is a conceptual diagram schematically illustrating a program method according to still another embodiment of the inventive concepts. Referring to FIG. 15, a j-bit program operation (j being a natural number more than 2) may be executed using i states TS1 to TSi (i being a natural number more than 2), and then an n-bit program operation may be performed through an overwrite operation.

It will be understood that in the example embodiments described herein, such as with respect to FIGS. 6-15, the memory controller 200 is configured to control the overwrite operation(s) as described.

Figure 16:
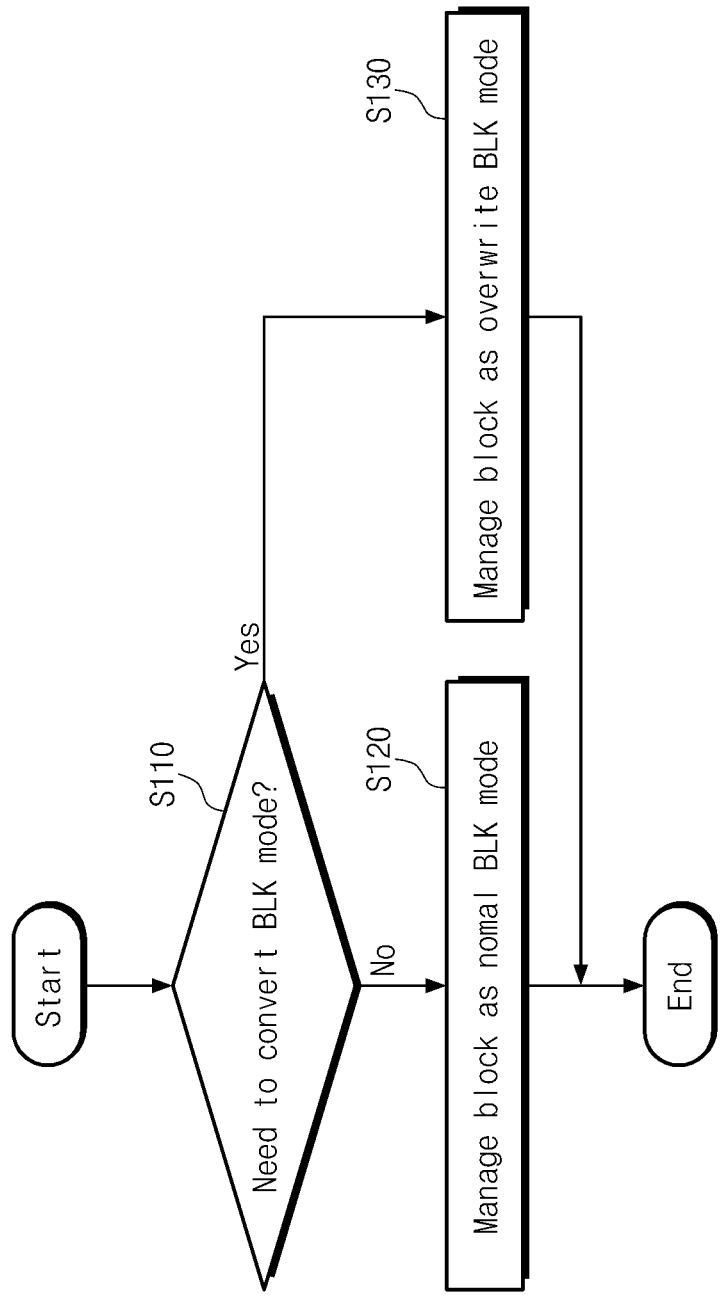
FIG. 16 is a flowchart illustrating a block managing method according to an embodiment of the inventive concepts.

FIG. 16 is a flowchart illustrating a block managing method according to an embodiment of the inventive concepts.

In operation S110, an overwrite management module 220 (refer to FIG. 1) may judge whether or not to change a block mode on any one block. Whether or not to change a block mode on any one block may be determined according to information associated with the erase possibility of a block, such as a healthy state of a block (e.g., P/E cycling, level of deterioration, bit error rate, etc.) or a data state of a block (e.g., the number of clean blocks (i.e., blocks in which data is not stored), a ratio of invalid pages of a block, etc.). Specific methods for judging whether to change the block mode will be described in more detail below with respect to other example method embodiments.

For example, the block mode may include a normal block mode and an overwrite block mode (or, an overwrite-ready state mode). The normal block mode may indicate a mode that a block is m-bit programmed at a program operation. The overwrite block mode may indicate a mode that an n-bit program operation is performed using an overwrite operation at a program operation.

The information associated with the erase possibility indicating a block state may be extracted from a mapping table of a memory controller 200 (refer to FIG. 1) and/or a nonvolatile memory device 100 (refer to FIG. 1).

If a change of the block mode is not required, in operation S120, a block management module 240 may manage a block using the normal block mode. If a change of the block mode is required, in operation S130, the block management module 240 may manage a block using the overwrite block mode. That is, at a program operation of the overwrite block mode, an 1-bit program operation may be executed through an overwrite operation (refer to FIGS. 5 to 10), or a program operation may be performed using a multi-dimension modulation scheme (refer to FIGS. 11 and 12).

In example embodiments, information indicating a changed block mode may be stored at a page of a corresponding block or at a meta region of the nonvolatile memory device 100 by a mapping table.

With the block managing method of the inventive concepts, it is possible to change a block mode into an overwrite block mode where a program operation is performed through an overwrite operation according to a block state.

Figure 17:
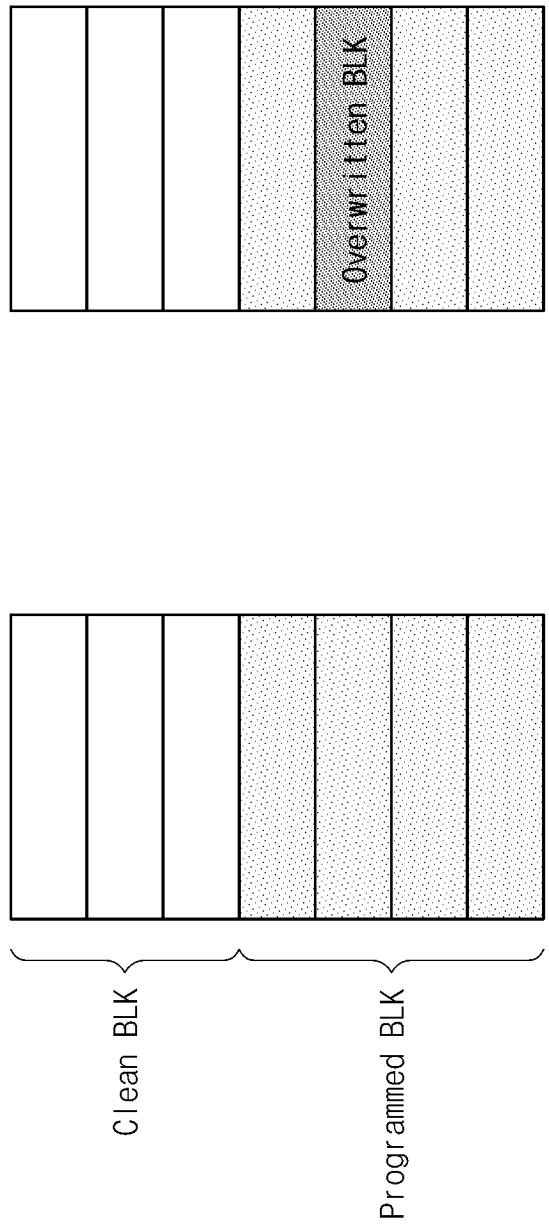
FIG. 17 is a diagram illustrating a block mode determining method according to an embodiment of the inventive concepts.

FIG. 17 is a diagram illustrating a block mode determining method according to an embodiment of the inventive concepts. Referring to FIG. 17, a block mode of one of the m-bit programmed blocks may be changed into an overwrite block mode when the number of clean blocks (i.e., blocks with no data stored) in the nonvolatile memory device is below a reference value. The reference value may be a design parameter determined through empirical study. Afterwards, when a program command for the block set to an overwrite block mode is input, a program operation using an overwrite operation may be performed.

Figure 18:
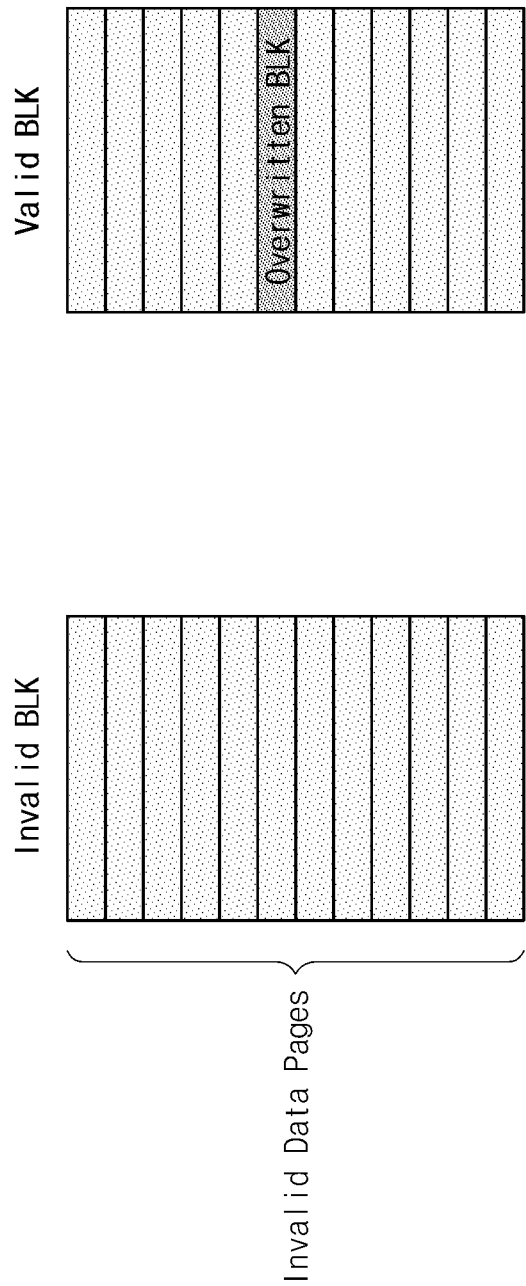
FIG. 18 is a diagram illustrating a block mode determining method according to another embodiment of the inventive concepts.

FIG. 18 is a diagram illustrating a block mode determining method according to another embodiment of the inventive concepts. Referring to FIG. 18, a block mode may be changed according to a state of a block. That is, when a block includes invalid data after a merge operation, the block mode may be changed into a overwrite block mode. Although a block storing invalid data is an invalid block, a block set to the overwrite block mode may become a valid block after a program operation is executed through an overwrite operation. Afterwards, when a program command on a block set to an overwrite block mode is received, a corresponding page in the block may be programmed through an overwrite operation.

Figure 19:
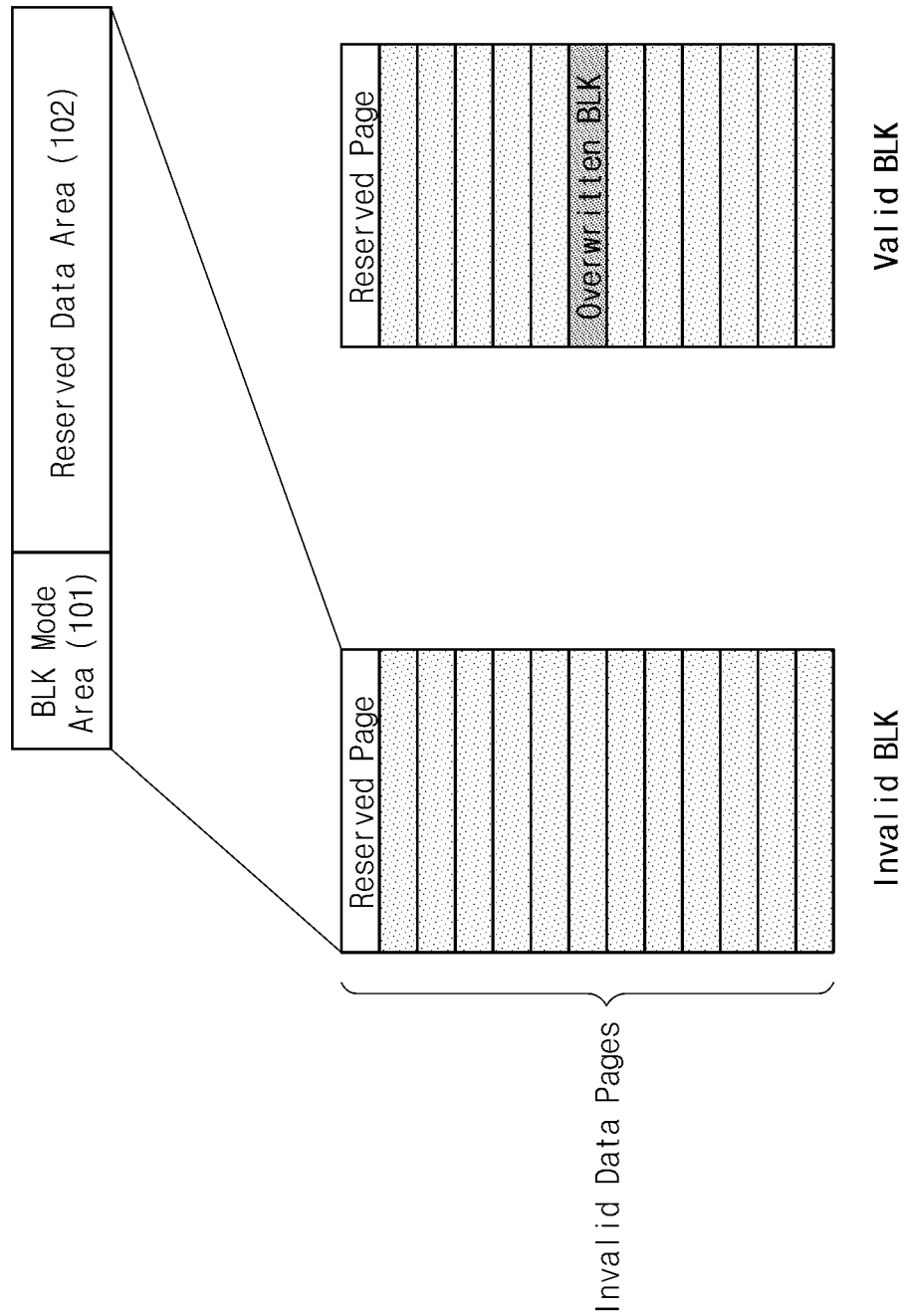
FIG. 19 is a diagram illustrating a block mode storing method according to an embodiment of the inventive concepts.

FIG. 19 is a diagram illustrating a block mode storing method according to an embodiment of the inventive concepts. Referring to FIG. 19, a block may include at least one reserved page for storing block information. The reserved page may include a block mode area 101 storing block mode information and a reserved data area 102 storing block associated information.

In example embodiments, the block mode information may include one of a bit value corresponding to a normal block mode and a bit value corresponding to an overwrite mode. Accordingly, the block mode area 101 stores state indicators indicating a state of the block. This will be described in more detail below. The block mode information may further include information associated with a number of overwrites of a block. Herein, this overwrite number may be a whole number indicating a number an overwrite operations executed within a block since the last time the block was erased. Also page information for overwrite operation on each page may be stored in the reserved data area when overwrite operation is performed on a page basis. Namely, the page information may be the same as the block mode information, but on a page basis. Also, additionally, or alternatively, sub-block information the same as the block mode information may be stored.

Figure 20:
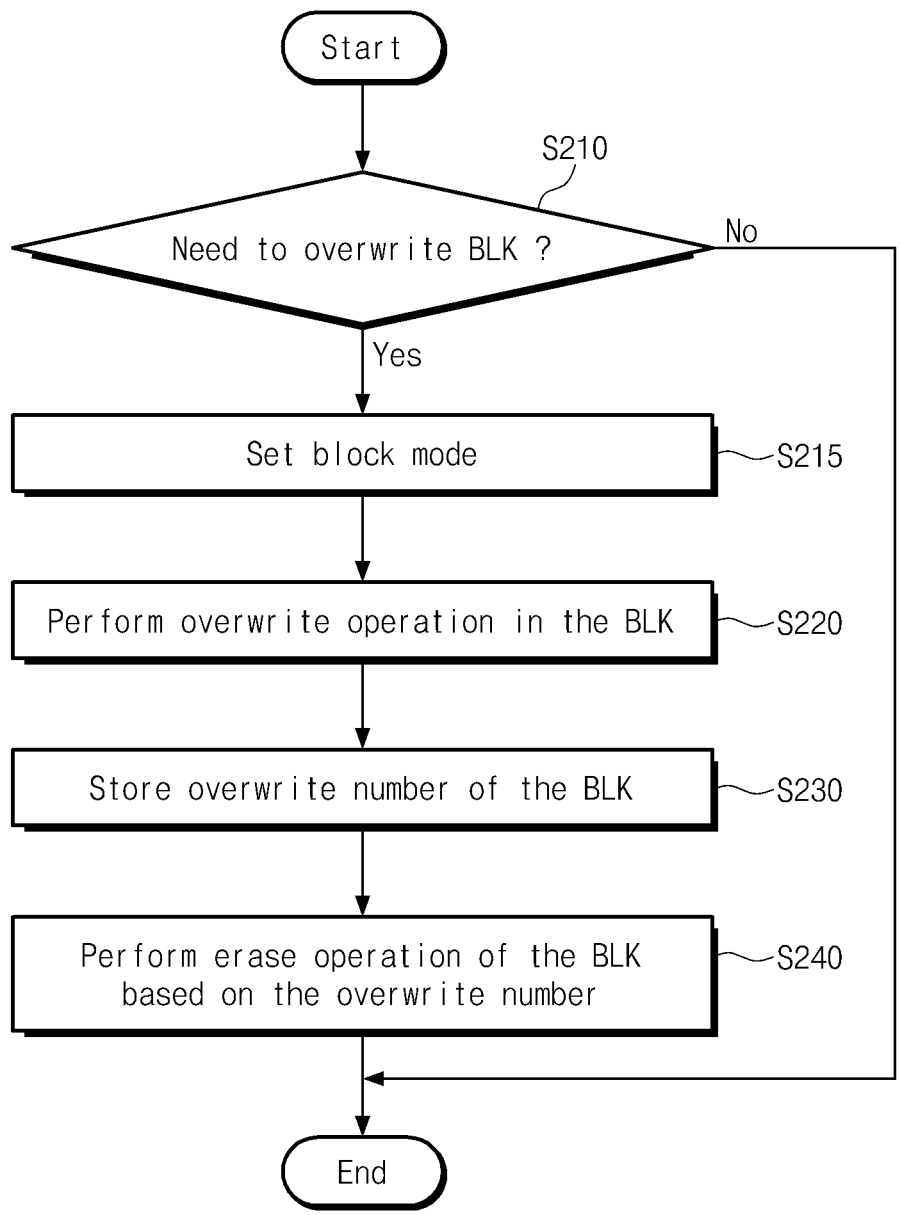
FIG. 20 is a flowchart illustrating an erase method of a memory system according to an embodiment of the inventive concepts.

FIG. 20 is a flowchart illustrating an operating method including a overwrite operation in a memory system according to an embodiment of the inventive concepts. Referring to FIGS. 1 and 20, in operation S210, an overwrite management module 220 may judge whether an overwrite operation of a block is needed.

In an example embodiment, an overwrite operation on a block may be executed when the number of clean blocks in a nonvolatile memory device 100 is below a reference value and a program command for a block previously experiencing a program operation (e.g., m-bit program operation) and storing invalid data is input. The reference value in this and other embodiments may be a design parameter determined through empirical study.

In an example embodiment, an overwrite operation of a block may be performed when the number of pages, storing invalid data, of the programmed block is over a reference value and a program command on an invalid page of the block is received.

In an example embodiment, an overwrite operation of a block may be performed when a level of deterioration of a block previously experiencing a program operation (a programmed block) is lower than a reference value and a program command for a block including invalid data is input. Herein, the level of deterioration being lower than the reference value may mean that it is possible to perform an overwrite operation.

In example embodiments, an overwrite operation of a block may be performed when an overwrite number of the block is smaller than a maximum value and a program command for the block including invalid data is received.

In an example embodiment, an overwrite operation of a block may be executed when the bit error rate (BER) of data read from the block over time window is less than a threshold. Here, the BER is indicative of a healthy state of the block.

In an embodiment, if one of the above-discussed condition occurs, the overwrite management module 220 may set a block including invalid data into a overwrite block mode in operation S215.

In another embodiment more than one of the conditions must be met to permit overwriting. And, in a further embodiment, all of the conditions must be met to permit overwriting.

In operation S220, an n-bit program operation on a block which has experienced an m-bit program operation and includes invalid data may be performed through an overwrite operation after receiving a program command for the n-bit operation. In example embodiments, the overwrite operation may be a single level program operation described with FIGS. 5 to 6 (or, FIGS. 8 to 10) or a program operation of a multi-dimension modulation manner described with reference to FIG. 12.

An overwrite management module 220 may store an overwrite number of a block at the nonvolatile memory device 100. Herein, the overwrite number on each block may be stored by a table in the memory controller, or the overwrite number may be stored at a page of each block (S230). In operation S240, a block management module 240 may perform an erase operation of a block based on the stored overwrite number in response to input erase command. For example, an erase operation may be executed when the overwrite number of a block is more than 1. Herein, an erase operation may be performed in an ISPE manner. If a block has not experienced any overwrite operation, an erase operation on a block may not be performed.

Although not shown in FIG. 20, the operating method of the inventive concepts may further comprise judging whether or not to perform an overwrite operation once more after the first overwrite operation before an erase operation of any block, based on an overwrite number of a block, a program/erase cycle number of a block, a block erase ratio, and/or a retention time.

With one example of the erase method of the inventive concepts, an overwrite operation may be performed before a block is erased.

Figure 21:
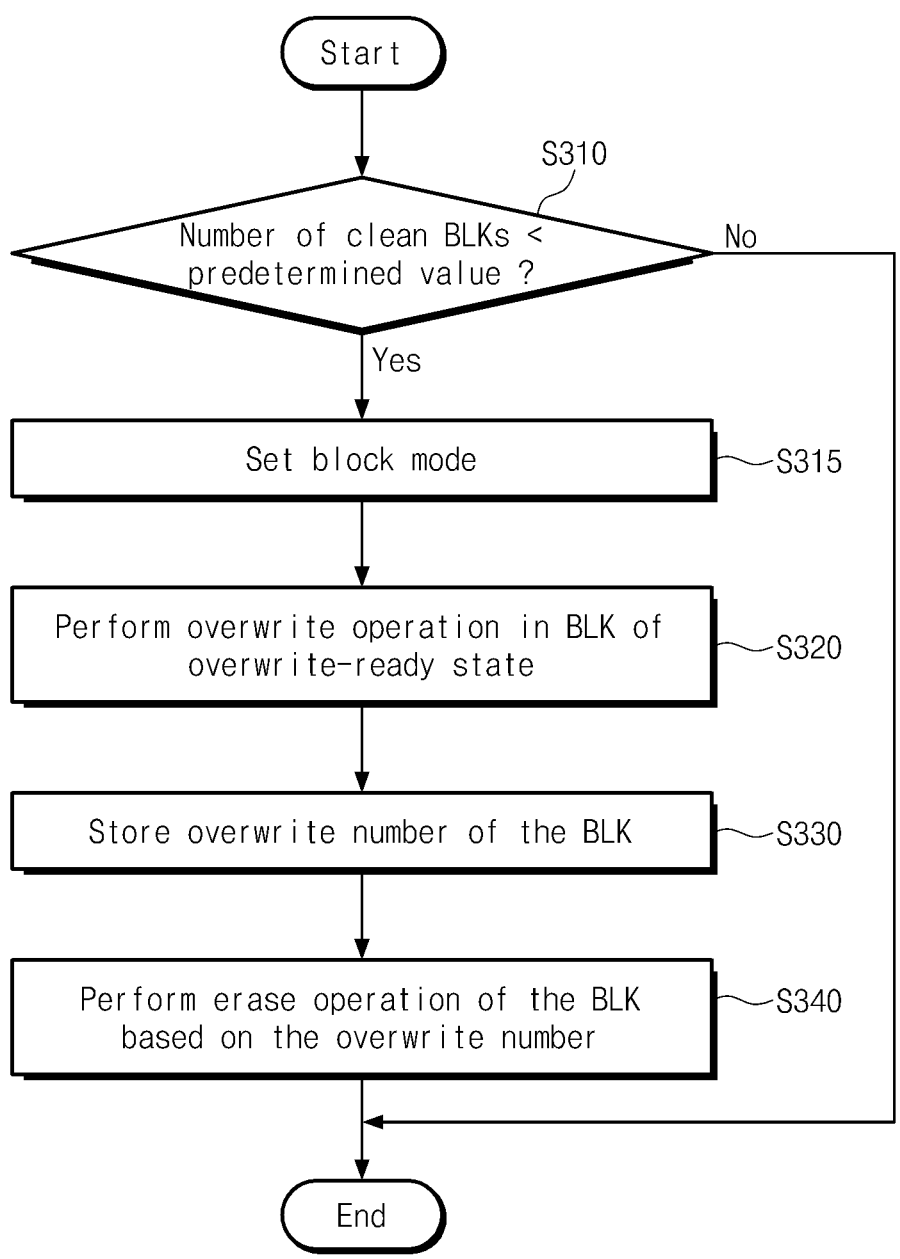
FIG. 21 is a flowchart illustrating an erase method of a memory system according to another embodiment of the inventive concepts.

FIG. 21 is a flowchart illustrating an operating method including a overwrite operation in a memory system according to another embodiment of the inventive concepts.

In operation S310, a block management module 220 (refer to FIG. 1) may judge whether the number of clean blocks is below a reference value. When the number of clean blocks is larger than the reference value, no erase operation may be carried out to make a clean block.

When the number of clean blocks is less than the reference value, in operation S315, the block management module 220 may set a block including invalid data into a overwrite block mode. The block set into the overwrite block mode is in an overwrite-ready state. Then a program command for an overwrite operation is input and the overwrite operation is selectively performed on the block in an overwrite-ready state. Herein, whether the block may be over-written is determined by an overwrite management module 220 (refer to FIG. 1) according to a data state or healthy state of a block. Afterwards, in operation S330, the overwrite management module 220 may store an overwrite number for each memory block in the nonvolatile memory device 100 (refer to FIG. 1). In operation S340, a block management module 240 may perform an erase operation of a block based on the stored overwrite number in response to an erase command in the same manner as described above with respect to step S240.

According to the operating method of the inventive concepts, an overwrite operation may be performed when the number of clean blocks in a nonvolatile memory device is below a reference value.

Figure 22:
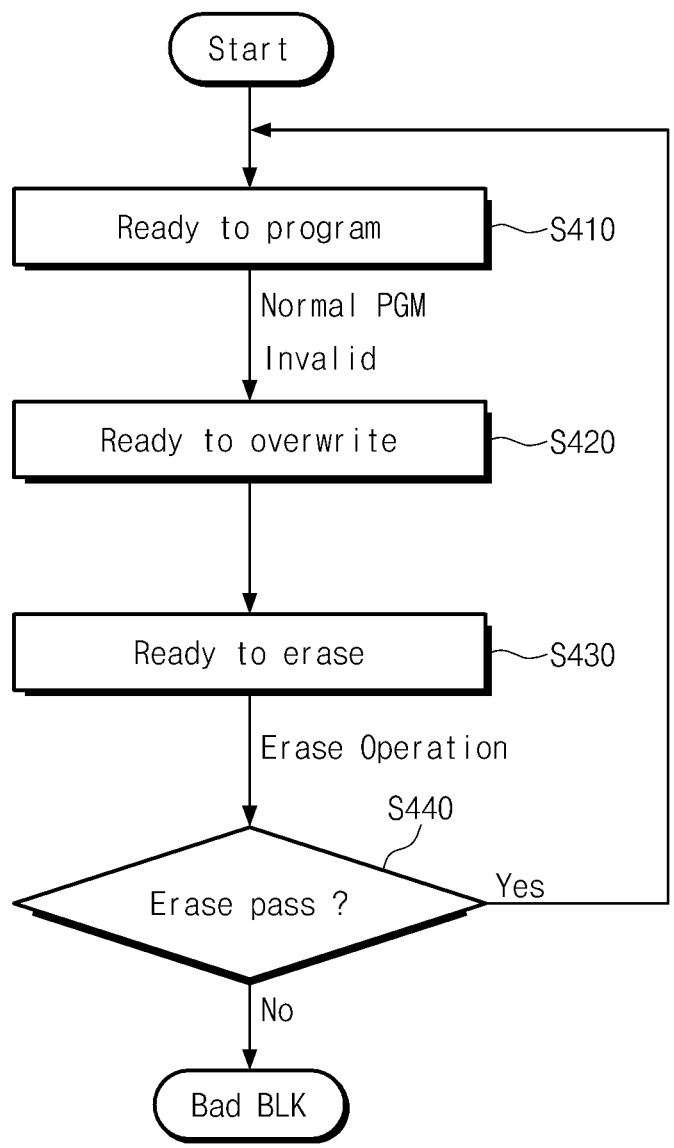
FIG. 22 is a diagram schematically illustrating lifetime of block according to an embodiment of the inventive concepts.

FIG. 22 is a diagram schematically illustrating lifecycle of a block according to an embodiment of the inventive concepts. Referring to FIG. 22, the lifecycle of a block may experience the following procedure. In operation S410, an initial block state may be a ready-to-program state. A multi-bit program operation may be carried out on the block being in a ready-to-program state.

In operation S420, the programmed block may enter a ready-to-overwrite state. The ready-to-overwrite state may be determined according to a data state of a corresponding block in reference to the deterioration level of a corresponding block or the number of clean blocks. A block having the ready-to-overwrite state may be programmed through an overwrite operation.

In operation S430, the block which has experienced an overwrite operation may enter a ready-to-erase state. The ready-to-erase state may be determined according to an overwrite number of a corresponding block. A block having the ready-to-erase state may be erased. Herein, an erase operation may be performed in an ISPE manner.

In operation S440, whether an erase operation is successful may be judged. If the erase operation passes, in operation S410, an erase-completed block may enter the ready-to-program state. If the erase operation fails, a corresponding block may be classified as a bad block.

According to the above description, a block may sequentially experience a state change from a ready-to-program state to a ready-to-overwrite state and a state change from a ready-to-overwrite state to a ready-to-erase state.

A block may have a programmed state including valid data and an invalid state including invalid data between the ready-to-program state and the ready-to-overwrite state. In the programmed state each memory cell in the block may store m-bit data. A block may have an overwritten state between the ready-to-overwrite state and the ready-to-erase state. In the overwritten state each memory cell in the block may store n-bit data.

Stated another way, a block may have a life cycle that progresses as follows: clean state (e.g., block erased and ready to be programmed or normal mode), programmed state (block programmed with valid data), invalid state (block stores invalid data), overwritable state (block stores invalid data and satisfies one or more of the above discussed conditions such that overwriting the invalid data without erasing the block is permitted), overwritten state (block has been overwritten without erasing according to one of the example embodiments and stores valid data), and back to the clean state. State indicators may be stored in a table in the block mode area 101 by the memory controller 200 to indicate the state of the block. Additionally, the state indicators may be stored in a table in the memory controller 200 such as in an flash translation layer (FTL) to provide more efficient control of the memory 100. Namely, by storing or downloading the state indicators into the memory controller 200, the memory controller 200 can more quickly access the state information. The number of overwrites may also be stored at the memory controller 200 as well.

By examining the state of a block, the memory controller 200 properly controls performing operations on the block. For example, and as will be appreciated from the above description of the block life cycle, the memory controller 200 only changes the state of a block to overwritable if the block is in the invalid state, and only overwrites data in a block if the state information indicates the overwritable state. Once the block has been overwritten, the memory controller 200 changes the state of the block to overwritten, which also indicates the data is valid. Still further, in embodiments where the overwrite data represents less bits than the data overwritten, then the overwrite state likewise indicates the block stores less data per memory cell than stored during, for example, the programmed state. Having overwritten a memory block, the memory controller 200 may then store the overwrite number, which indicates the number of times the block has been overwritten since the last erasure. As will be appreciated, in embodiments where a block may be overwritten more than once before erasure, the life cycle includes additional invalid, overwritable and overwritten states. For example, where a block may be overwritten twice, the life cycle is as follows: clean state, programmed state, invalid state, overwritable state, overwritten state, invalid state, overwritable state, overwritten state, and back to the clean state. By examining the overwrite number, the memory controller 200 determines whether to enter the first overwritable state and perform the first overwriting, or whether to enter the second overwritable state and perform the second overwriting. Based on this determination, the memory controller 200 programs the memory cells in the block to achieve different states.

In one embodiment, the program and verify voltages for the normal and various overwrite states may be stored in a table. The table may be stored in the memory 100, and/or may be stored in the memory controller 200. Additionally, or alternatively, these voltages may be hardwired into the circuitry of the memory controller 200. In the same manner, other voltages (e.g., voltage for reading data) that change depending on the normal and various overwrite states that may be stored in the table or hardwired into the memory controller 200.

While described in the example embodiments above as being stored on a block basis, the state information may instead, or additionally, be stored on a page basis and/or a sub-block basis at the memory 100 and, optionally, at the memory controller 200.

It will be appreciated that embodiments described above may be combined in various ways. For example, the embodiments of overwriting only the memory cells farther from the substrate may be combined with the embodiments regarding block life cycle and state information. This is but one example combination, and many more will be readily apparent.

Figure 23:
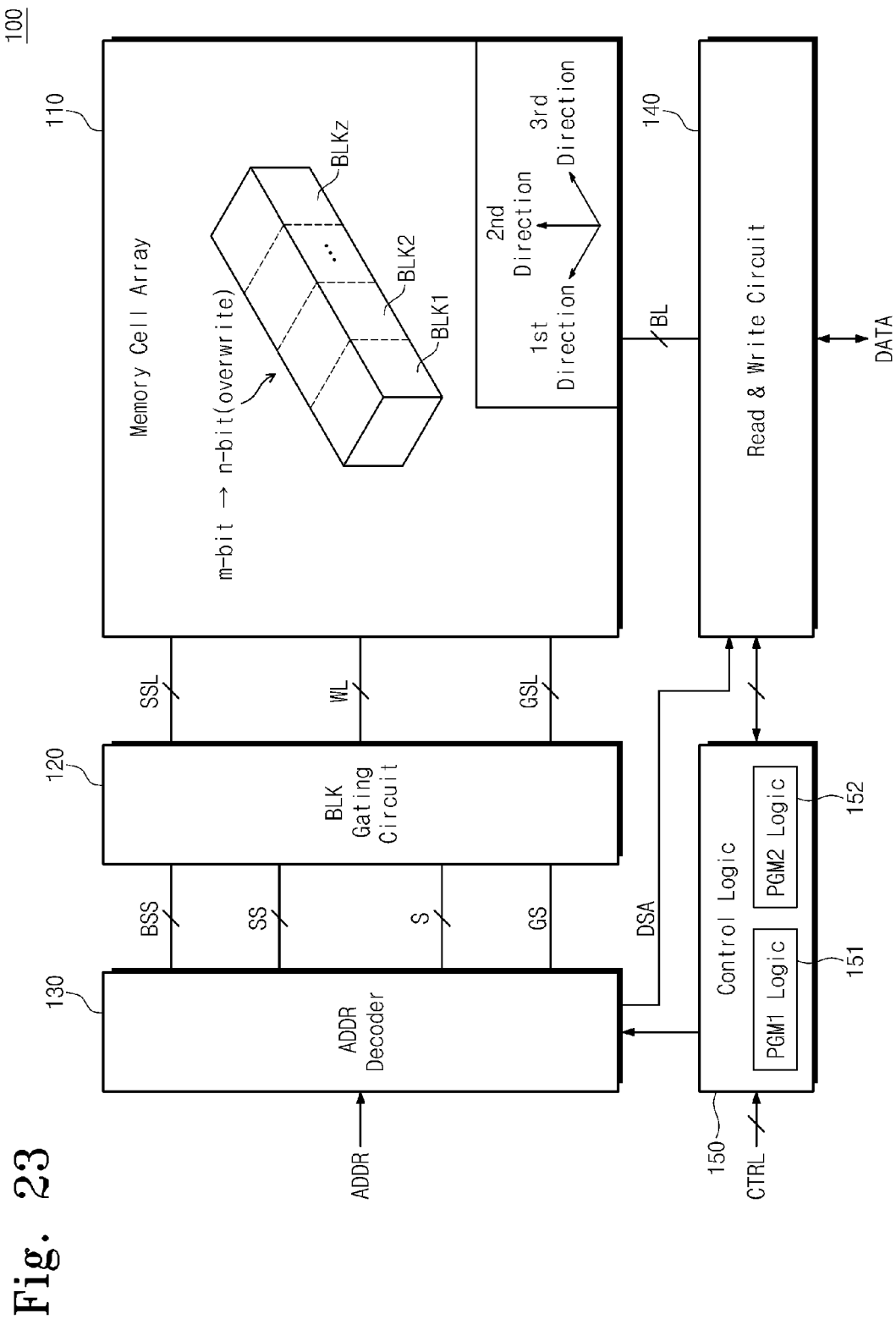
FIG. 23 is a diagram showing a nonvolatile memory device in FIG. 1 according to an embodiment of the inventive concepts.

Turning now to FIG. 23, FIG. 23 is a diagram showing a nonvolatile memory device in FIG. 1 according to an embodiment of the inventive concepts. Referring to FIG. 23, a nonvolatile memory device 100 may include a memory cell array 110, a block gating circuit 120, an address decoder 130, a read/write circuit 140, and control logic 150.

The memory cell array 110 may include a plurality of memory blocks BLK1 to BLKz (z being an integer of 2 or more). Each of the memory blocks BLK1 to BLKz may form structures stacked along a second direction (or, a vertical direction) on a plane extending along first and third directions.

Each block may include a plurality of vertical strings extending in a vertical direction to the substrate. Each vertical string may include a plurality of memory cells stacked along a vertical direction to the substrate. Memory cells may be provided on the substrate along rows and columns, and may form a three-dimensional structure stacked in a vertical direction to the substrate. In example embodiments, the memory cell array 110 may include a plurality of memory cells each storing one or more bits of data.

The block gating circuit 120 may be connected to the memory cell array 110 through string selection lines SSL, word lines WL, and ground selection lines GSL. The block gating circuit 120 may be connected to the address decoder 130 through string lines SS, selection lines S, and ground lines GS. The block gating circuit 120 may be provided with a block selection signal BSS from the address decoder 130.

The block gating circuit 120 may select a block of the memory cell array in response to the block selection signal BSS. The block gating circuit 120 may electrically connect string selection lines SSL, word lines WL, and a ground selection line or ground selection lines GSL of the selected block with the string lines SS, the selection lines S, and the ground line or ground lines GS.

The address decoder 130 may be connected with the block gating circuit 120 through the string lines SS, the selection lines S, and the ground line or ground lines GS. The address decoder 130 may be configured to operate responsive to the control of the control logic 150. The address decoder 130 may receive an address ADDR from an external device.

The address decoder 130 may be configured to decode a row address of the input address ADDR. The address decoder 130 may generate the block selection signal BSS based on a decoded block address of the decoded row address. The address decoder 130 may be configured to select a selection line, corresponding to the decoded row address, from among the selection lines S. The address decoder 130 may be configured to select a string line and a ground line, corresponding to the decoded row address, from among the string lines SS and the ground line or ground lines GS.

The address decoder 130 may be configured to decode a column address of the input address ADDR. The address decoder 130 may transfer the decoded column address DCA to the read/write circuit 140.

In example embodiments, the address decoder 130 may include a row decoder decoding a row address, a column decoder decoding a column address, an address buffer storing an input address ADDR, and the like.

The read/write circuit 140 may be connected to the memory cell array 110 through bit lines BL. The read/write circuit 140 may be configured to exchange data with an external device. The read/write circuit 140 may operate responsive to the control of the control logic 150. The read/write circuit 140 may be provided with the decoded column address DCA from the address decoder 130. The read/write circuit 140 may select the bit lines BL in response to the decoded column address DCA.

In example embodiments, the read/write circuit 140 may receive data from an external device to store it at the memory cell array 110. The read/write circuit 140 may read data from the memory cell array 110 to output it to the external device. The read/write circuit 140 may read data from a first storage region of the memory cell array 110 to store it at a second storage region of the memory cell array 110. That is, the read/write circuit 140 may perform a copy-back operation.

In example embodiments, the read/write circuit 140 may include elements such as a page buffer (or, referred to as a page register), a column selecting circuit, a data buffer, and the like. Alternatively, the read/write circuit 140 may include elements such as a sense amplifier, a write driver, a column selecting circuit, a data buffer, and the like.

The control logic 150 may be connected with the address decoder 130 and the read/write circuit 140. The control logic 150 may be configured to control an overall operation of the nonvolatile memory device 100. The control logic 150 may include first program logic 151 and second program logic 152. The first program logic 151 may perform an m-bit program operation (m being an integer of more than 1) with respect to memory cells connected to upper word lines (e.g., WL4 to WL7 in FIG. 5) and memory cells connected to lower word lines (e.g., WL0 to WL3 in FIG. 5). As illustrated in FIG. 5, the second program logic 152 may perform an n-bit program operation (n being an integer less than m) with respect to the memory cells connected to the upper word lines (e.g., WL4 to WL7) during an overwrite operation.

The nonvolatile memory device 100 of the inventive concept may perform an n-bit program operation with respect to m-bit programmed memory cells using an overwrite operation.

Figure 24:
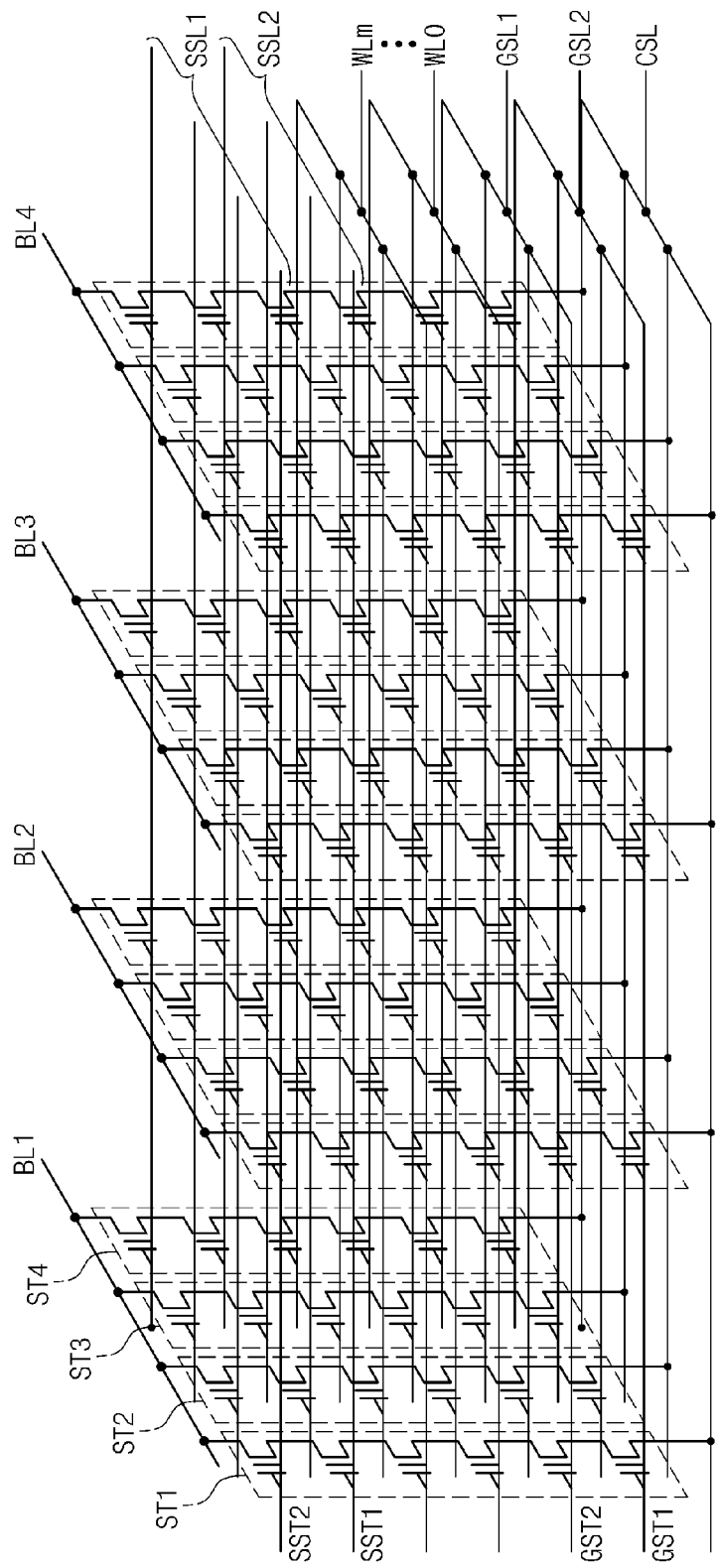
FIG. 24 is a circuit diagram illustrating one of blocks in FIG. 23.

FIG. 24 is a circuit diagram illustrating one of the blocks in FIG. 23. Referring to FIG. 24, a block may have a shared bit line structure. For example, four strings ST1 to ST4 may be connected between a first bit line BL1 and a common source line CSL to be connected to the first bit line BL1. The first bit line BL1 may correspond to a conductive material extending in a first direction.

Each of the strings ST1 to ST4 may include two serially-connected string selection transistors SST1 and SST2, which are connected with string selection lines SSL1 and SSL2, respectively. In example embodiments, at least one of the string selection transistors SST1 and SST2 can be programmed to control a threshold voltage. Each of the strings ST1 to ST4 may include two serially-connected ground selection transistors GST1 and GST2, which are connected with ground selection lines GSL1 and GSL2, respectively. In example embodiments, at least one of the ground selection transistors GST1 and GST2 can be programmed to control a threshold voltage.

FIG. 25 is a table illustrating correlation between the number of extra states and erase frequency reduction when all cells of a block of a memory system have an extra state. Herein, an erase frequency may be an erase number needed when the same number of pages is written. The erase frequency ERS_Freq may satisfy the following equation 1.

$$\text{ERS\_Freq} \propto \frac{1}{m + s \times p} \quad \text{[Equation 1]}$$

In the equation 1, m indicates the number of bits per memory cell, s indicates the number of extra states beyond $2^m$ states, and p indicates the percentage of memory cells having an extra state in a memory block.

Erase frequency reduction ERS_Freq_reduction due to an overwrite operation may satisfy the following equation 2.

$$\text{ERS\_Freq\_reduction} = \frac{s \times p}{m + s \times p} \quad \text{[Equation 2]}$$

Referring to FIG. 25, as the number of extra states increases, the effect of erase frequency reduction may maximally increase up to 50%.

An average number of program operations executed until an erase operation is performed may be expressed by the following equation 3.

$$\text{num\_program} \propto m + s_1 p_1 + s_2 p_2 + \ldots + s_N P_N \quad \text{[Equation 3]}$$

In the equation 3, m indicates the number of bits per memory cell, $s_i$ indicates the number of extra states beyond $2^m$ at a sub-block (or SLC over-writable number per cell at an ith sub block), $p_i$ indicates a portion of an ith sub-block of a block, and N indicates the number of sub-blocks over-writable with different numbers.

An erase frequency ERS_Freq needed when the same number of pages is written may satisfy the following equation 4.

$$\text{ERS\_Freq} \propto \frac{1}{m + \sum_{i=1}^{N} S_i p_i} \quad \text{[Equation 4]}$$

Erase frequency reduction ERS_Freq_reduction due to an overwrite operation may satisfy the following equation 2.

$$\text{ERS\_Freq\_reduction} = \frac{\sum_{i=1}^{N} S_i p_i}{m + \sum_{i=1}^{N} S_i p_i} \quad \text{[Equation 5]}$$

FIG. 26 is a table illustrating correlation between the number of extra states and erase frequency reduction when the half of cells of a block of a memory system has an extra state. For example, as illustrated in FIG. 5, memory cells connected to upper word lines may have an extra state, and memory cells connected to lower word lines may not have an extra state. Thus, referring to the equation 3, N may be 2, and $p_1$ and $p_2$ may be 0.5. At this time, illustrated in FIG. 26, as the number of extra states increases, the effect of erase frequency reduction may maximally increase up to 33%.

A memory system according to an embodiment of the inventive concept may reduce an erase cycle number by performing an overwrite operation before an erase operation and a response time that is from when a program command is received to when a program operation is completed.

While a conventional memory system has a long erase time, the memory system of the inventive concept may reduce an erase time. Further, the reliability/ISPE cycle associated with an erase operation may be improved.

The inventive concepts are applicable to various devices.

Figure 27:
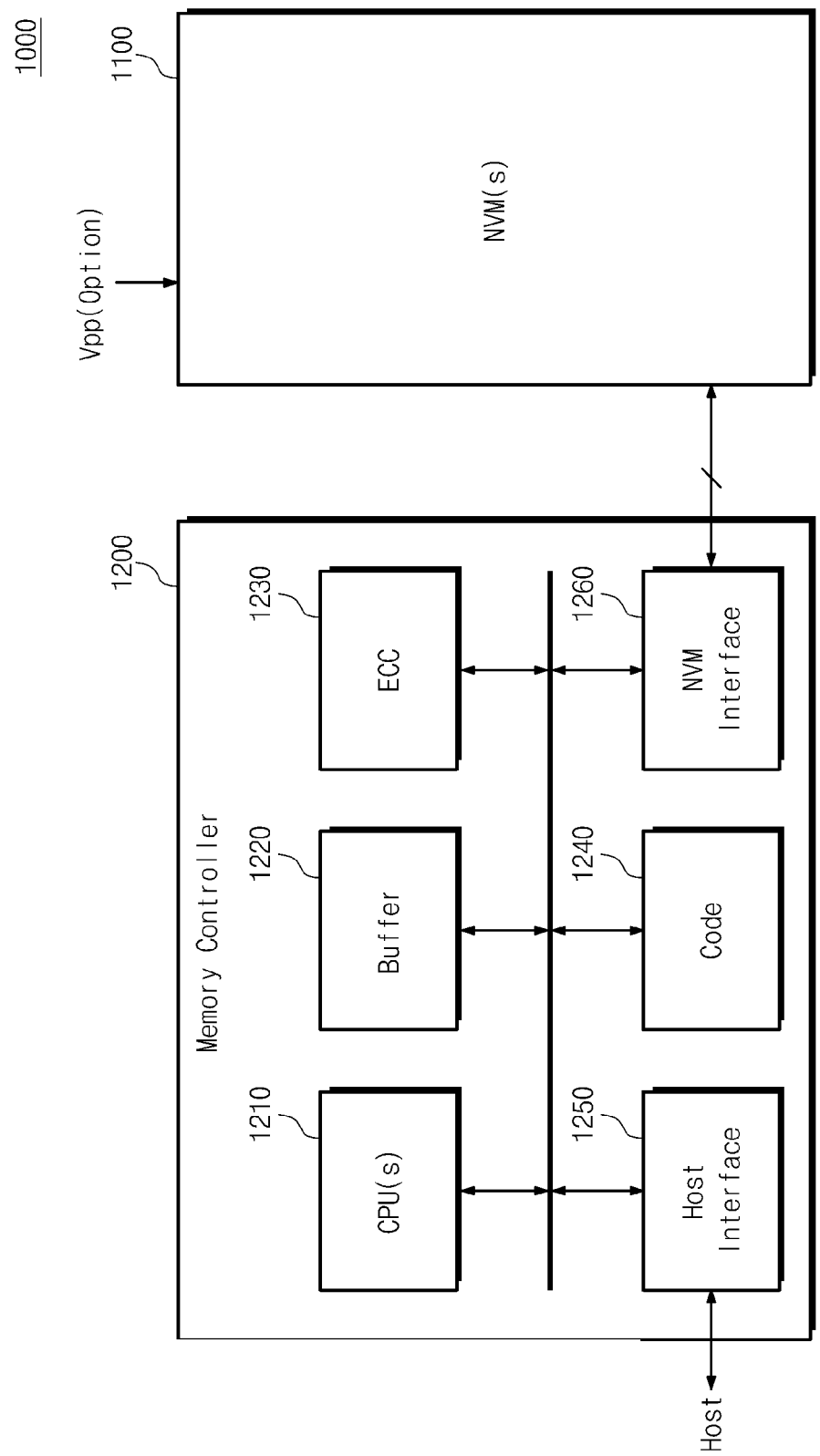
FIG. 27 is a block diagram schematically illustrating a memory system according to an embodiment of the inventive concepts.

FIG. 27 is a block diagram schematically illustrating a memory system according to an embodiment of the inventive concepts. Referring to FIG. 27, a memory system 1000 may include at least one nonvolatile memory device 1100 and a memory controller 1200. The memory system 1000 may perform an overwrite operation before an erase operation as described with reference to FIGS. 1 to 26.

The nonvolatile memory device 1100 may be optionally supplied with a high voltage Vpp from the outside. The memory controller 1200 may be connected with the nonvolatile memory device 1100 via a plurality of channels. The memory controller 1200 may include at least one Central Processing Unit (CPU) 1210, a buffer memory 1220, an ECC circuit 1230, a ROM 1240, a host interface 1250, and a memory interface 1260. Although not shown in FIG. 27, the memory controller 1200 may further comprise a randomization circuit that randomizes and de-randomizes data. The memory system 1000 according to an embodiment of the inventive concepts is applicable to a perfect page new (PPN) memory.

Detailed description of the memory system is disclosed in U.S. Pat. No. 8,027,194 and U.S. Patent Publication No. 2010/0082890, the entire contents of which are herein incorporated by reference.

Figure 28:
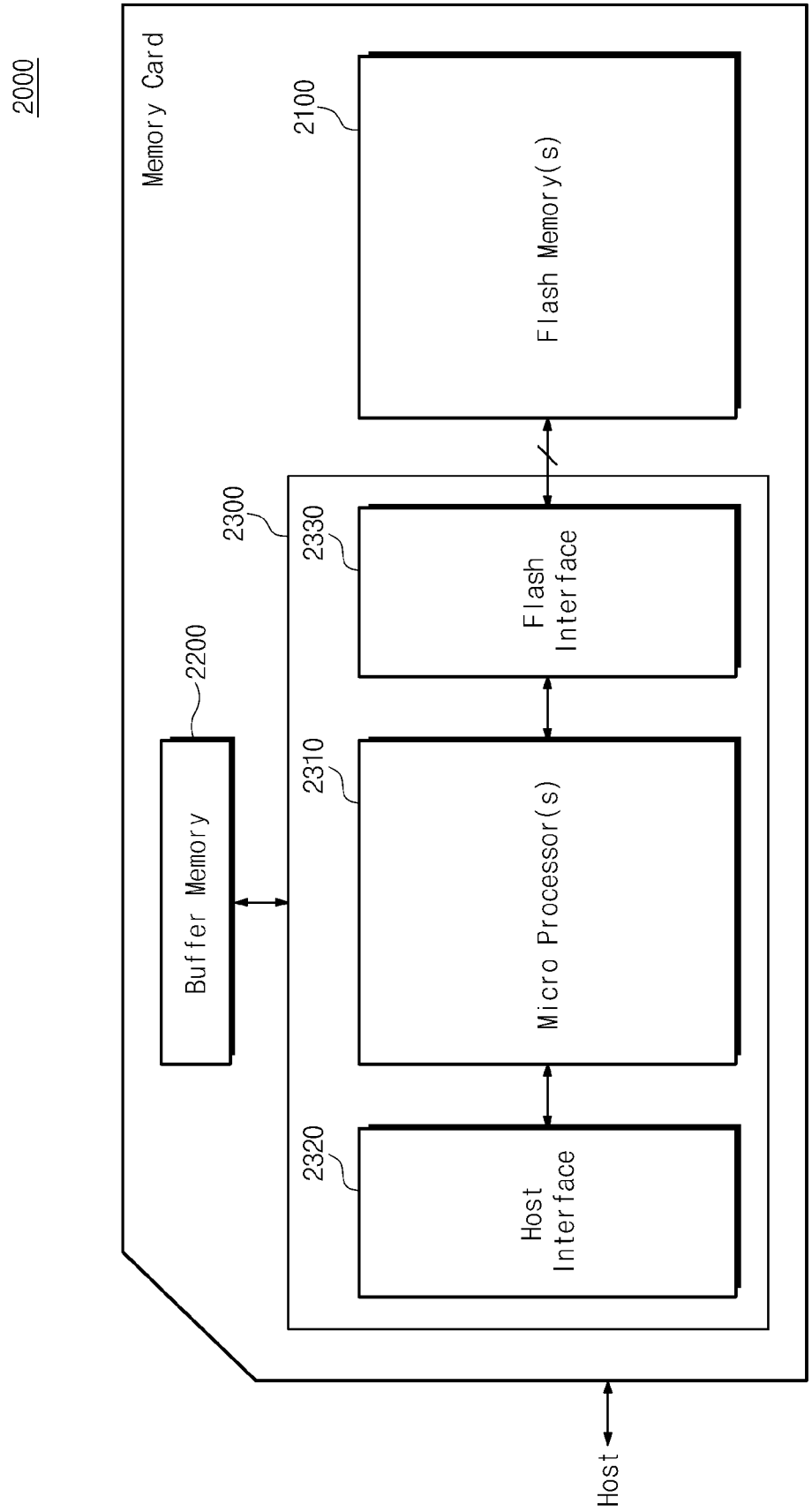
FIG. 28 is a block diagram schematically illustrating a memory card according to an embodiment of the inventive concepts.

FIG. 28 is a block diagram schematically illustrating a memory card according to an embodiment of the inventive concepts. Referring to FIG. 28, a memory card 2000 may include at least one flash memory 2100, a buffer memory device 2200, and a memory controller 2300 for controlling the flash memory 2100 and the buffer memory device 2200.

The memory card 2000 may perform an overwrite operation before an erase operation as described with reference to FIGS. 1 to 26.

The buffer memory device 2200 may be used to temporarily store data generated during the operation of the memory card 2000. The buffer memory device 2200 may be implemented using a DRAM or an SRAM. The memory controller 2300 may be connected with the flash memory 2100 via a plurality of channels. The memory controller 2300 may be connected between a host and the flash memory 2100. The memory controller 2300 may be configured to access the flash memory 2100 in response to a request from the host.

The memory controller 2300 may include at least one microprocessor 2310, a host interface 2320, and a flash interface 2330. The microprocessor 2310 may be configured to drive firmware. The host interface 2320 may interface with the host via a card protocol (e.g., SD/MMC) for data exchanges between the host and the memory card 2000. The memory card 2000 is applicable to Multimedia Cards (MMCs), Security Digitals (SDs), miniSDs, memory sticks, smartmedia, and transflash cards.

Detailed description of the memory card 2000 is disclosed in U.S. Patent Publication No. 2010/0306583, the entire contents of which are herein incorporated by reference.

Figure 29:
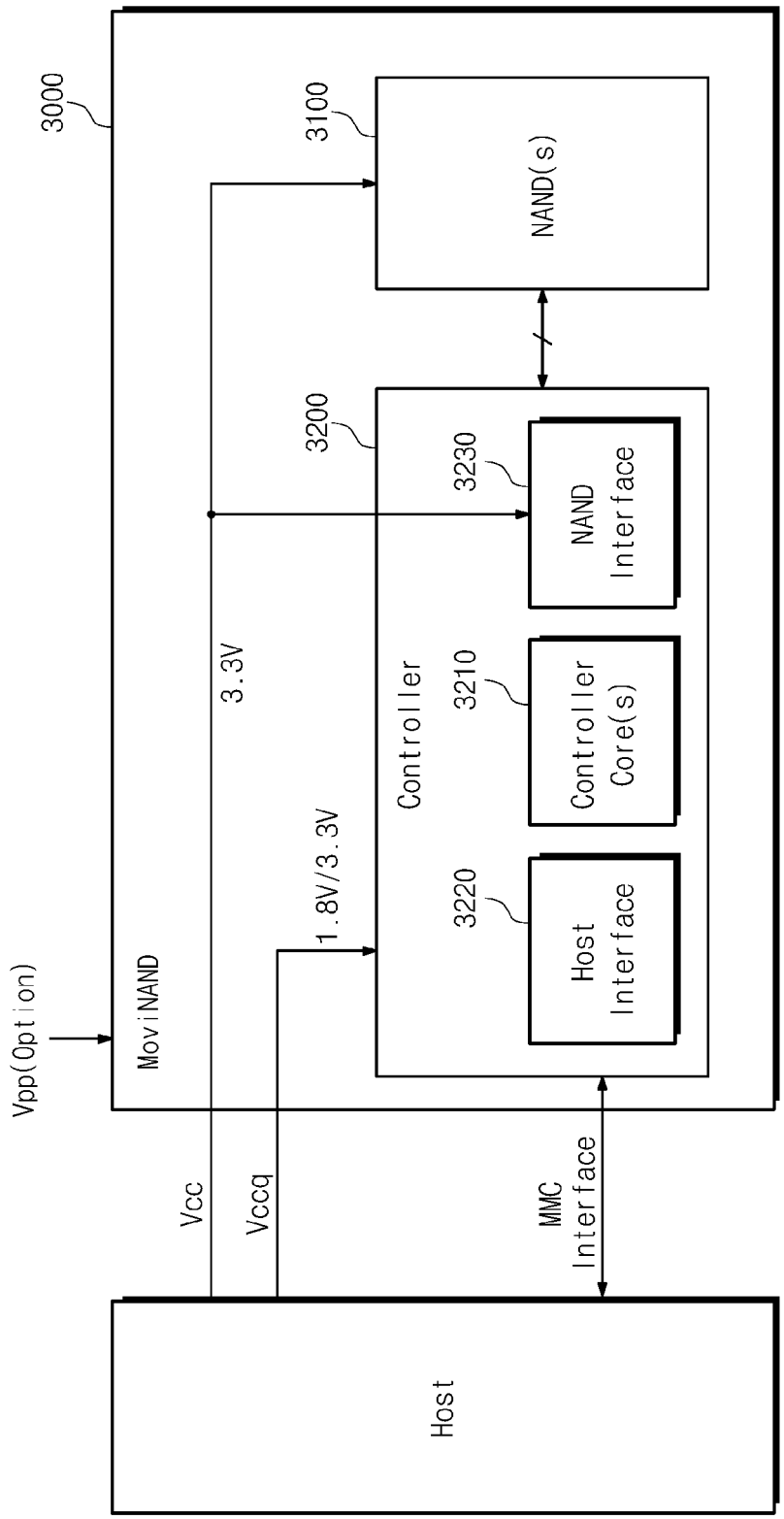
FIG. 29 is a block diagram schematically illustrating a moviNAND according to an embodiment of the inventive concepts.

FIG. 29 is a block diagram schematically illustrating a moviNAND according to an embodiment of the inventive concepts. Referring to FIG. 29, a moviNAND device 3000 may include at least one NAND flash memory device 3100 and a controller 3200. The moviNAND device 3000 may support the MMC 4.4 (or, referred to as "eMMC") standard. The moviNAND device 3000 may perform an overwrite operation before an erase operation as described with reference to FIGS. 1 to 26.

The NAND flash memory device 3100 may be a single data rate (SDR) NAND flash memory device or a double data rate (DDR) NAND flash memory device. In example embodiments, the NAND flash memory device 3100 may include NAND flash memory chips. Herein, the NAND flash memory device 3100 may be implemented by stacking the NAND flash memory chips at one package (e.g., FBGA, Fine-pitch Ball Grid Array, etc.).

The controller 3200 may be connected with the flash memory device 3100 via a plurality of channels. The controller 3200 may include at least one controller core 3210, a host interface 3220, and a NAND interface 3230. The controller core 3210 may control an overall operation of the movi-NAND device 3000.

The host interface 3220 may be configured to perform an MMC interface between the controller 3210 and a host. The NAND interface 3230 may be configured to interface between the NAND flash memory device 3100 and the controller 3200. In example embodiments, the host interface 3220 may be a parallel interface (e.g., an MMC interface). In other example embodiments, the host interface 3250 of the moviNAND device 3000 may be a serial interface (e.g., UHS-II, UFS, etc.).

The moviNAND device 3000 may receive power supply voltages Vcc and Vccq from the host. Herein, the power supply voltage Vcc (about 3V) may be supplied to the NAND flash memory device 3100 and the NAND interface 3230, while the power supply voltage Vccq (about 1.8V/3V) may be supplied to the controller 3200. In example embodiments, an external high voltage Vpp may be optionally supplied to the moviNAND device 3000.

The moviNAND device 3000 according to an embodiment of the inventive concept may be advantageous to store mass data as well as may have an improved read characteristic. The moviNAND device 3000 according to an embodiment of the inventive concept is applicable to small and low-power mobile products (e.g., a Galaxy S, iPhone, etc.).

The moviNAND device 3000 illustrated in FIG. 29 may be supplied with a plurality of power supply voltages Vcc and Vccq. However, the inventive concept is not limited thereto. The moviNAND device 3000 can be configured to generate a power supply voltage of 3.3V suitable for a NAND interface and a NAND flash memory by boosting or regulating the power supply voltage Vcc internally. Internal boosting or regulating is disclosed in U.S. Pat. No. 7,092,308, the entire contents of which are herein incorporated by reference.

The inventive concept are applicable to a solid state drive (SSD).

Figure 30:
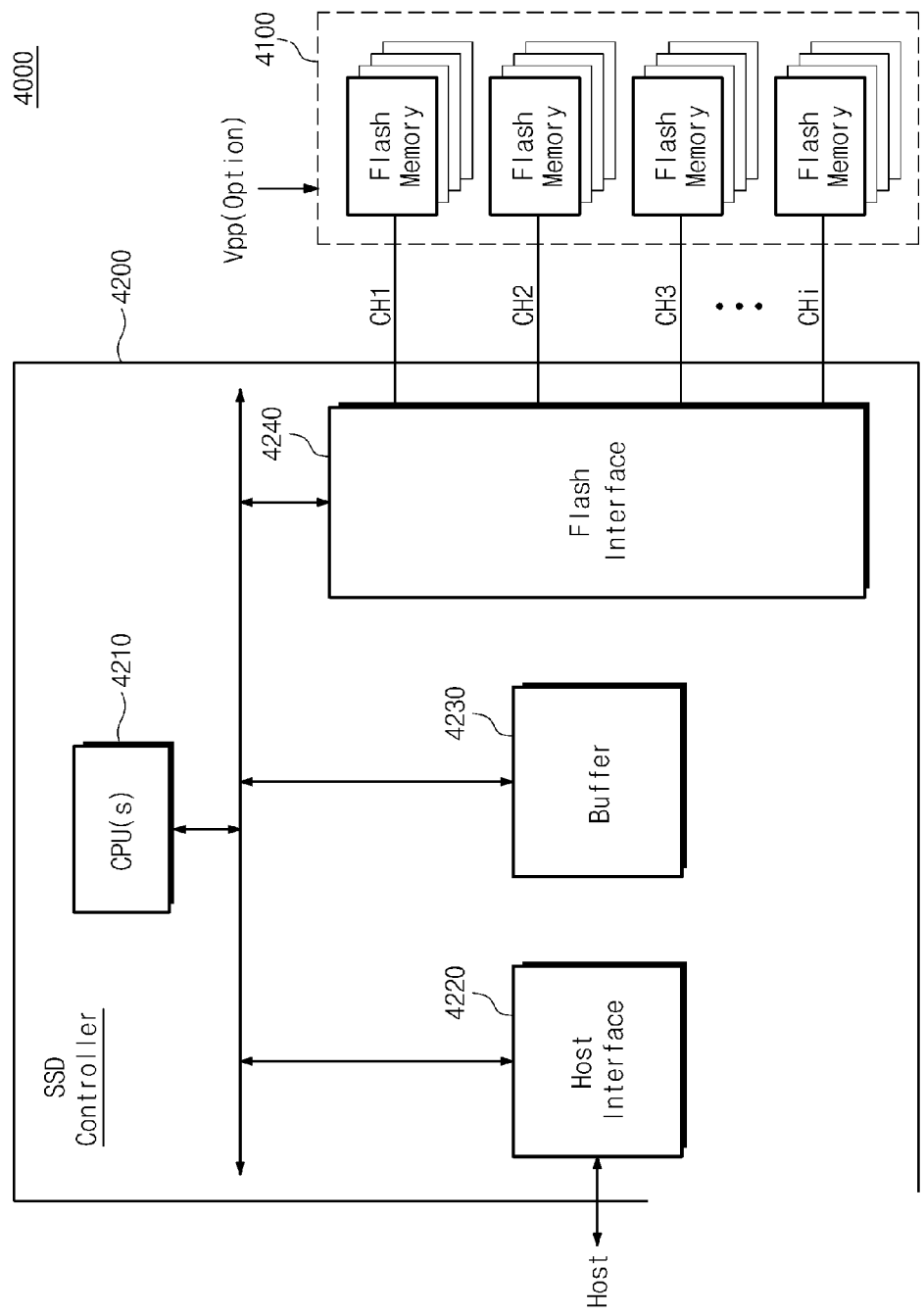
FIG. 30 is a block diagram schematically illustrating a solid state drive according to an embodiment of the inventive concepts.

FIG. 30 is a block diagram schematically illustrating a solid state drive according to an embodiment of the inventive concepts. Referring to FIG. 30, a solid state drive (SSD) 4000 may include a plurality of flash memory devices 4100 and an SSD controller 4200. The SSD 4000 may perform an overwrite operation before an erase operation as described with reference to FIGS. 1 to 26.

The flash memory devices 4100 may be optionally supplied with a high voltage Vpp from the outside. The SSD controller 4200 may be connected to the flash memory devices 4100 via a plurality of channels CH1 to CHi. The SSD controller 4200 may include at least one CPU 4210, a host interface 4220, a buffer memory 4230, and a flash interface 4240.

Under the control of the CPU 4210, the host interface 4220 may exchange data with a host through the communication protocol. In example embodiments, the communication protocol may include the Advanced Technology Attachment (ATA) protocol. The ATA protocol may include a Serial Advanced Technology Attachment (SATA) interface, a Parallel Advanced Technology Attachment (PATA) interface, an External SATA (ESATA) interface, and the like. in other example embodiments, the communication protocol may include the Universal Serial Bus (UBS) protocol. Data to be received or transmitted from or to the host through the host interface 4220 may be delivered through the buffer memory 4230 without passing through a CPU bus, under the control of the CPU 4210.

The buffer memory 4230 may be used to temporarily store data transferred between an external device and the flash memory devices 4100. The buffer memory 4230 can be used to store programs to be executed by the CPU 4210. The buffer memory 4230 may be implemented using an SRAM or a DRAM. The buffer memory 4230 in FIG. 30 may be included within the SSD controller 4200. However, the inventive concepts are not limited thereto. The buffer memory 4230 according to an embodiment of the inventive concept can be provided at the outside of the SSD controller 4200.

The flash interface 4240 may be configured to interface between the SSD controller 4200 and the flash memory devices 4100 that are used as storage devices. The flash interface 4240 may be configured to support NAND flash memories, One-NAND flash memories, multi-level flash memories, or single-level flash memories.

The SSD 400 according to an embodiment of the inventive concepts may improve the reliability of data by storing random data at a program operation. More detailed description of the SSD 4000 is disclosed in U.S. Pat. No. 8,027,194 and U.S. Patent Publication Nos. 2007/0106836 and 2010/0082890, the entire contents of which are herein incorporated by reference.

Figure 31:
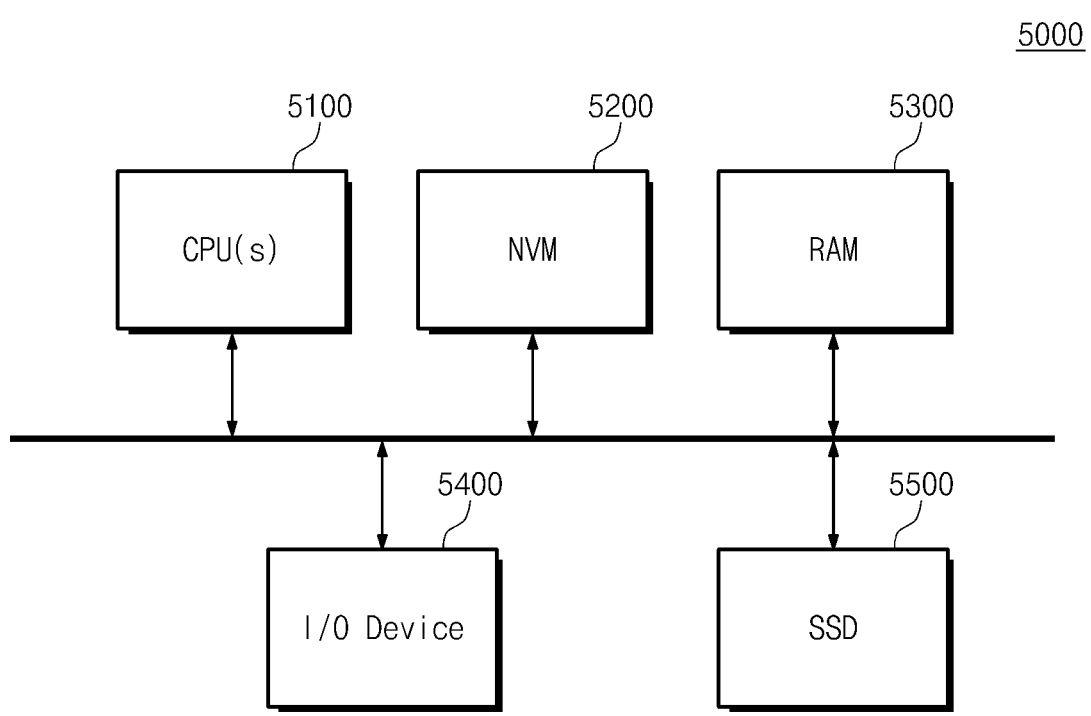
FIG. 31 is a block diagram schematically illustrating a computing system including an SSD in FIG. 30 according to an embodiment of the inventive concepts.

FIG. 31 is a block diagram schematically illustrating a computing system including an SSD in FIG. 30 according to an embodiment of the inventive concepts. Referring to FIG. 31, a computing system 5000 may include at least one CPU 5100, a nonvolatile memory device 5200, a RAM 5300, an input/output (I/O) device 5400, and an SSD 4000.

The CPU 5100 may be connected to a system bus. The nonvolatile memory device 5200 may store data used to drive the computing system 5000. Herein, the data may include a start command sequence or a basic I/O system (BIOS) sequence. The RAM 5300 may temporarily store data generated during the execution of the CPU 5100. The I/O device 5400 may be connected to the system bus through an I/O device interface such as keyboards, pointing devices (e.g., mouse), monitors, modems, and the like. The SSD 5500 may be a readable storage device and may be implemented the same as the SSD 4000 of FIG. 30.

Figure 32:
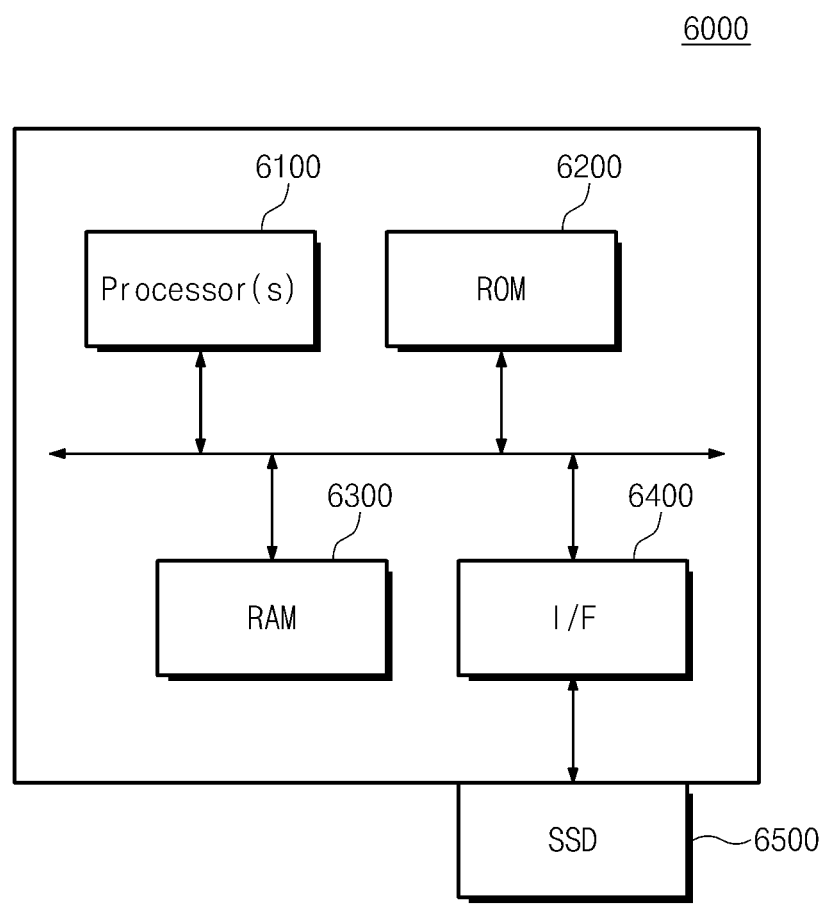
FIG. 32 is a block diagram schematically illustrating an electronic device including an SSD in FIG. 30 according to an embodiment of the inventive concepts.

FIG. 32 is a block diagram schematically illustrating an electronic device including an SSD in FIG. 30 according to an embodiment of the inventive concepts. Referring to FIG. 32, an electronic device 6000 may include a processor 6100, a ROM 6200, a RAM 6300, a flash interface 6400, and at least one SSD 6500.

The processor 6100 may access the RAM 6300 to execute firmware codes or other codes. Also, the processor 6100 may access the ROM 6200 to execute fixed command sequences such as a start command sequence and a basic I/O system (BIOS) sequence. The flash interface 6400 may be configured to interface between the electronic device 6000 and the SSD 6500. The SSD 6500 may be detachable from the electronic device 6000. The SSD 6500 may be implemented the same as the SSD 4000 of FIG. 30.

The electronic device 6000 may include cellular phones, personal digital assistants (PDAs), digital cameras, camcorders, portable audio players (e.g., MP3), and portable media players (PMPs).

Figure 33:
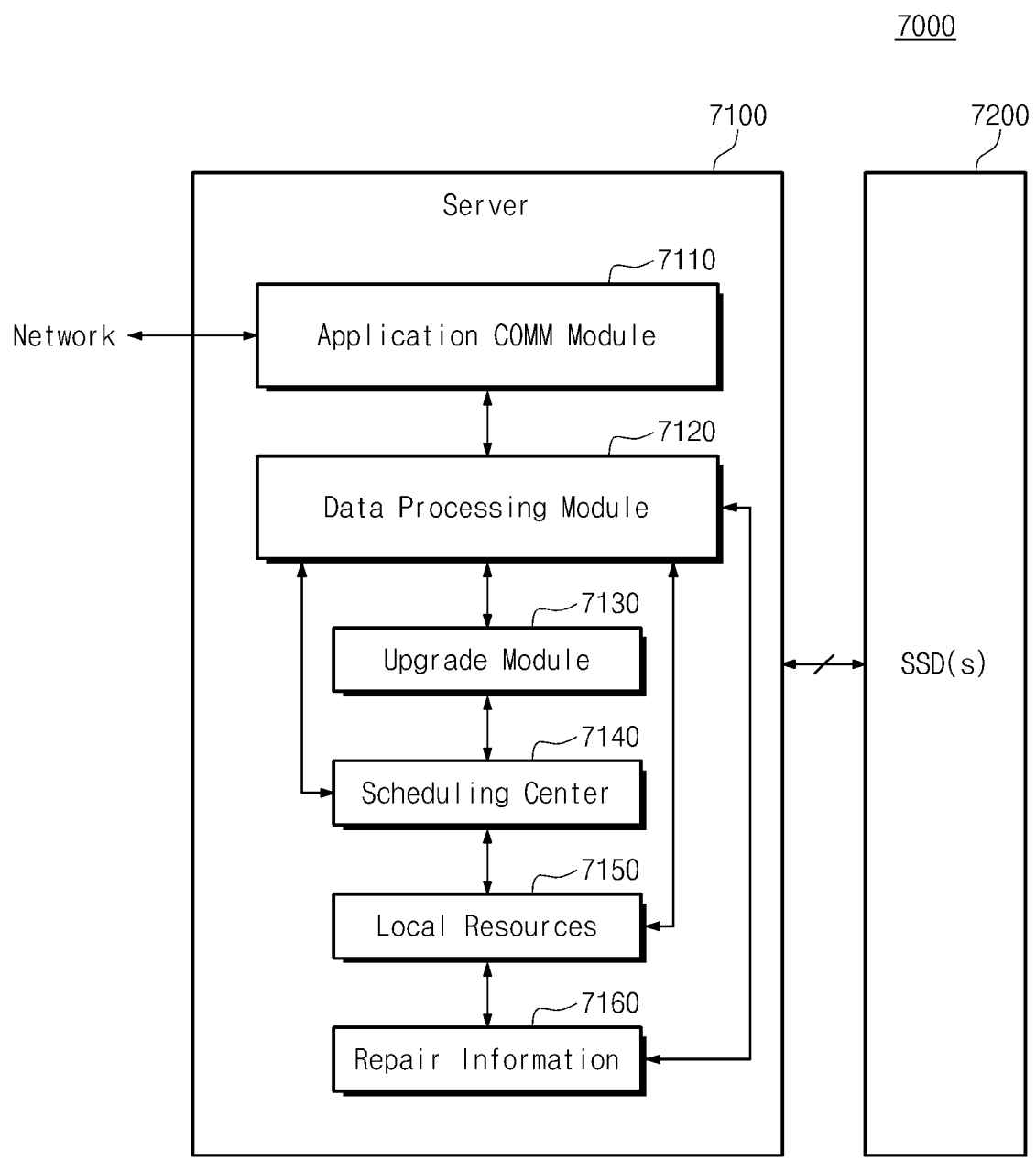
FIG. 33 is a block diagram schematically illustrating a server system including an SSD in FIG. 30 according to an embodiment of the inventive concepts.

FIG. 33 is a block diagram schematically illustrating a server system including an SSD in FIG. 30 according to an embodiment of the inventive concepts. Referring to FIG. 33, a server system 7000 may include a server 7100 and at least one SSD 7200 that stores data used to drive the server 7100. The SSD 7200 may be configured the same as an SSD 4000 of FIG. 30.

The server 7100 may include an application communication module 7110, a data processing module 7120, an upgrade module 7130, a scheduling center 7140, a local resource module 7150, and a repair information module 7160. The application communication module 7110 may be configured to communicate with a computing system connected to a network and the server 7100, or to allow the server 7100 to communicate with the SSD 7200. The application communication module 7110 may transmit data or information, provided through a user interface, to the data processing module 7120.

The data processing module 7120 may be linked to the local resource module 7150. Here, the local resource module 7150 may provide a list of repair shops/dealers/technical information to a user on the basis of information or data inputted to the server 7100. The upgrade module 7130 may interface with the data processing module 7120. Based on information or data received from the SSD 7200, the upgrade module 7130 may perform upgrades of a firmware, a reset code, a diagnosis system, or other information on electronic appliances.

The scheduling center 7140 may provide real-time options to the user based on the information or data inputted to the server 7100. The repair information module 7160 may interface with the data processing module 7120. The repair information module 7160 may be used to provide repair-related information (e.g., audio, video or document files) to the user. The data processing module 7120 may package information related to the information received from the SSD 7200. The packaged information may be transmitted to the SSD 7200 or may be displayed to the user.

The inventive concepts are applicable to mobile products (e.g., smart phones, mobile phones, etc.).

Figure 34:
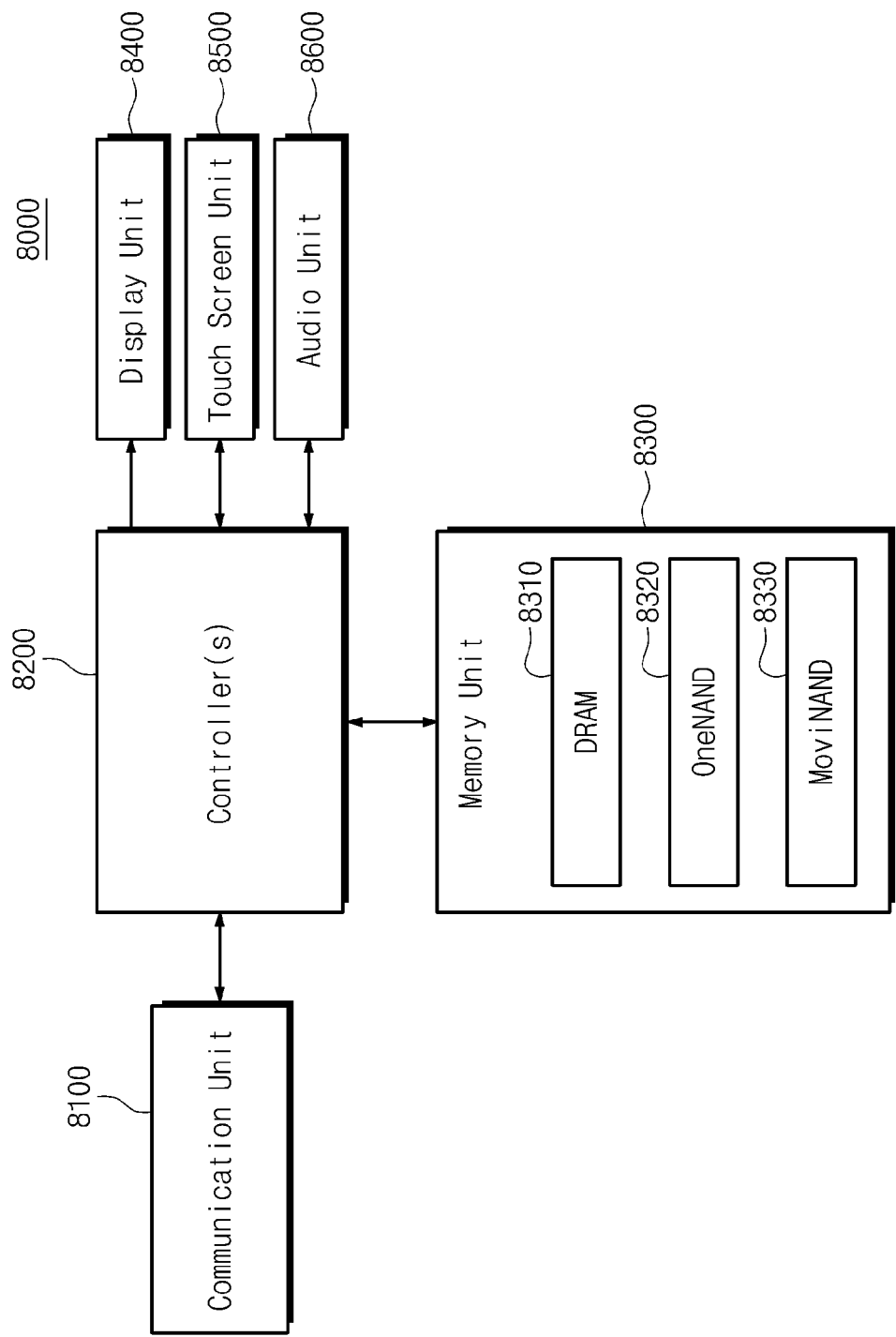
FIG. 34 is a block diagram schematically illustrating a mobile device according to an embodiment of the inventive concepts.

FIG. 34 is a block diagram schematically illustrating a mobile device according to an embodiment of the inventive concepts. Referring to FIG. 34, a mobile device 8000 may include a communication unit 8100, a controller 8200, a memory unit 8300, a display unit 8400, a touch screen unit 8500, and an audio unit 8600.

The memory unit 8300 may include at least one DRAM 8310 and at least one nonvolatile memory device 8330 such as moviNAND or eMMC. The nonvolatile memory device 8330 may perform an overwrite operation before an erase operation as described with reference to FIGS. 1 to 26.

Detailed description of the mobile device is disclosed in U.S. Patent Publication Nos. 2010/0010040, 2010/0062715, 2010/00199081, and 2010/0309237, the entire contents of which are herein incorporated by reference.

The inventive concept are applicable to tablet products.

Figure 35:
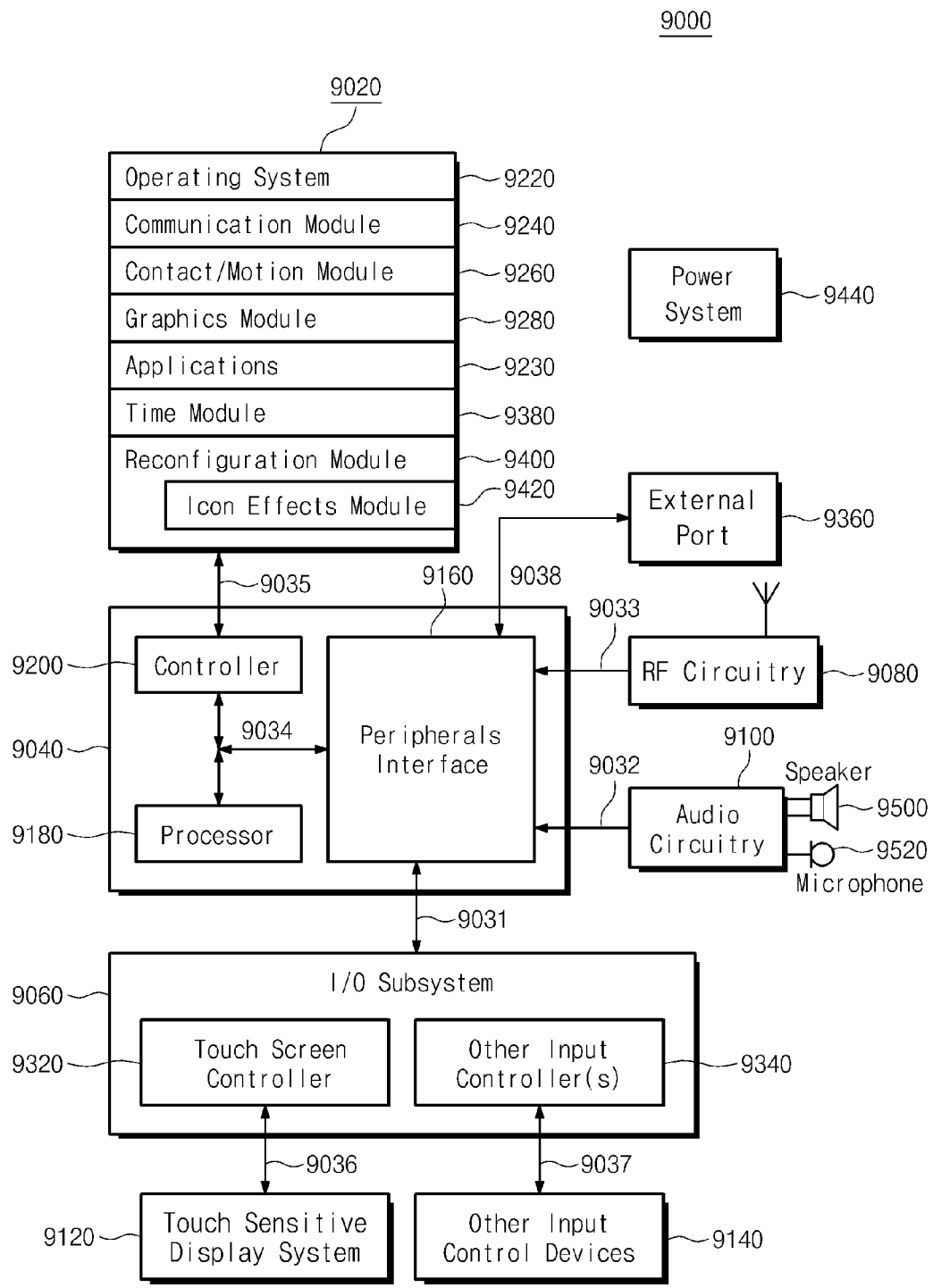
FIG. 35 is a block diagram schematically illustrating a handheld electronic device according to an embodiment of the inventive concepts.

FIG. 35 is a block diagram schematically illustrating a handheld electronic device according to an embodiment of the inventive concepts. Referring to FIG. 35, a handheld electronic device 9000 may include at least one computer-readable media 9020, a processing system 9040, an input/output sub-system 9060, a radio frequency circuit 9080, and an audio circuit 9100. Respective constituent elements can be interconnected by at least one communication bus or a signal line 9030.

The handheld electronic device 9000 may be a portable electronic device including a handheld computer, a tablet computer, a cellular phone, a media player, a PDA, or a combination of two or more thereof. Herein, the at least one computer-readable media 9020 may perform an overwrite operation before an erase operation as described with reference to FIGS. 1 to 26. Detailed description of the handheld electronic device 9000 is disclosed in U.S. Pat. No. 7,509,588, the entirety of which is incorporated by reference herein.

A memory system or a storage device according to the inventive concepts may be mounted in various types of packages. Examples of the packages of the memory system or the storage device according to the inventive concepts may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

While the inventive concepts have been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method, comprising:
   overwriting a memory cell storing m-bit data to store n-bit data, n being less than or equal to m, the memory cell having one of a first plurality of program states when storing the m-bit data, and the memory cell having one of a second plurality of program states when storing the n-bit data, the second plurality of program states including at least one program state not in the first plurality of program states.

2. The method of claim 1, wherein the program state not in the first plurality of program states has a threshold voltage distribution greater than the threshold distributions of the first plurality of states.

3. The method of claim 1, wherein the second plurality of program states includes more than one program state not in the first plurality of program states.

4. The method of claim 1, further comprising:
overwriting the memory cell storing n-bit data to store p-bit data, p being less than or equal to n, the memory cell having a third plurality of memory states when storing the p-bit data, and the third plurality of program states including at least one program state not in the first plurality and the second plurality of program states.

5. The method of claim 1, wherein a memory includes the memory cell, the memory is divided into blocks of memory cells, and further comprising:
determining if an invalid block of the blocks is overwritable, the invalid block storing invalid data; and wherein the overwriting is permitted if the determining determines the invalid block is overwritable.

6. The method of claim 5, wherein the determining determines the invalid block is overwritable based on a number of clean blocks of the blocks.

7. The method of claim 5, wherein the determining determines the invalid block is overwritable based on a number of free pages in the invalid block, each free page not storing any data.

8. The method of claim 5, wherein the determining determines the invalid block is overwritable based on a health state of the invalid block, the health state indicating a level of deterioration of the invalid block.

9. The method of claim 8, wherein the health state is based on a number of program/erase cycles that the invalid block has undergone.

10. The method of claim 8, wherein the health state is based on a bit error rate for data read when the invalid block was a valid block.

11. The method of claim 5, wherein the determining determines the invalid block is overwritable based on a number of clean blocks in the memory and a health state of the invalid block, the health state indicating a level of deterioration of the invalid block.

12. The method of claim 1, wherein a memory includes the memory cell, the memory is divided into blocks of memory cells, each block being divided into pages, and further comprising:
determining if an invalid page including the memory cell is overwritable, the invalid page storing invalidated data; and wherein
the overwriting is permitted on the invalid page if the determining determines the invalid page including the memory cell is overwritable.

13. The method of claim 5, further comprising:
storing a first indicator indicating that the invalid block is overwritable if the determining determines the invalid block is overwritable.

14. The method of claim 13, further comprising:
storing a second indicator indicating that at least one of the blocks has been overwritten after the overwriting.

15. The method of claim 14, further comprising:
storing a third indicator indicating a number of times the at least one of the blocks has been overwritten since last erased after the overwriting.

16. A memory system, comprising:
a memory including at least one memory string, the memory string including a plurality of memory cells connected in series, the plurality of memory cells arranged vertically with respect to a substrate, the plurality of memory cells being divided into at least a first group of memory cells and a second group of memory cells, the first group of memory cells disposed further from the substrate than the second group of memory cells; and
a controller configured to program data into the plurality of memory cells based on a first set of threshold voltage distributions, and the controller configured to overwrite data in memory cells of the first group based on a second set of threshold voltage distributions, an amount of overwritten data in a memory cell of the first group being less than or equal to an amount of programmed data, the second set of threshold voltage distributions including at least one threshold voltage distribution not in the first set of threshold distributions.

17. The memory system of claim 16, wherein the controller is configured to not overwrite memory cells in the second group.

18. The memory system of claim 16, wherein the controller is configured overwrite data in memory cells of the second group based on a third set of threshold voltage distributions, an amount of overwritten data in a memory cell of the second group being less than or equal to an amount of programmed data, the third set of threshold voltage distributions including at least one threshold voltage distribution not in the first set of threshold distributions.

19. The memory system of claim 18, wherein the third set of threshold distributions differs from the second set of threshold distributions.

20. The memory system of claim 16, wherein the controller is configured to overwrite the memory cells of the first group such that m-bit data is represented at least in part by threshold voltage distributions in at least two memory cells of the first group.

21. The memory system of claim 20, wherein the at least two memory cells of the first group include memory cells at different vertical locations within their respective memory strings.

22. The memory system of claim 16, wherein
the memory includes a plurality of memory strings, and the memory cells of the plurality of memory strings being divided into blocks;
the controller is configured to store state information for at least one of the blocks, the state information indicating one of a clean state, a programmed state, an invalid state, an overwritable state, and an overwritten state, the clean state indicating the block is erased, the programmed state indicating the block stores valid data, the invalid state indicating the block stores invalid data, the overwritable state indicating that overwriting data is permitted without erasing invalid data stored in the block, the overwritten state indicating that at least a portion of the data stored in the block has been overwritten without erasing the block.

23. The memory system of claim 22, wherein the controller is configured to not overwrite memory cells in the second group.

24. The memory system of claim 22, wherein the controller is configured to permit changing the state information for the block to the overwritable state only if a current state of the block is the invalid state.

25. The memory system of claim 22, wherein the controller is configured to overwrite data in the block only if the state information of the block indicates the overwritable state.

26. The memory system of claim 25, wherein the controller is configured to change the state information of the block to the overwritten state after overwriting of the block.

27. The memory system of claim 22, wherein the controller is configured to store an overwrite number if the state information indicates the overwritten state, the overwrite number indicating a number of times of overwriting since the block was last erased.

28. The memory system of claim 22, wherein the controller is configured to store the state information in the memory.

29. The memory system of claim 28, wherein the controller is configured to store the state information in a page of the block.

30. The memory system of claim 22, wherein the controller is configured to store the state information in the controller.

31. The memory system of claim 22, wherein the overwritten state indicates the block stores valid data.

32. The memory system of claim 22, wherein the overwritten state indicates the block stores less data per memory cell than stored during the programmed state.

33. A method of managing a memory having a plurality of memory cells divided into blocks, comprising:
    storing state information for at least one of the blocks, the state information indicating one of a clean state, a programmed state, an invalid state, an overwritable state, and an overwritten state, the clean state indicating the block is erased, the programmed state indicating the block stores valid data, the invalid state indicating the block stores invalid data, the overwritable state indicating that overwriting data is permitted without erasing invalid data stored in the block, the overwritten state indicating that at least a portion of the data stored in the block has been overwritten without erasing the block; and
    performing an operation on the block based on the state information.

34. The method of claim 33, further comprising:
permitting changing the state information for the block to the overwritable state only if a current state of the block is the invalid state.

35. The method of claim 33, wherein the performing selectively overwrites data in the block only if the state information of the block indicates the overwritable state.

36. The method of claim 35, further comprising:
    changing the state information of the block to the overwritten state after overwriting of the block.

37. The method of claim 33, further comprising:
    storing an overwrite number if the state information indicates the overwritten state, the overwrite number indicating a number of times since the block was last erased.

38. The method of claim 33, wherein the storing stores the state information in the memory.

39. The method of claim 38, wherein the storing stores the state information in a page of the block in the memory.

40. The method of claim 33, wherein the storing stores the state information in a controller of the memory.

41. The method of claim 33, wherein the overwritten state indicates the block stores valid data.

42. The method of claim 33, wherein the overwritten state indicates the block stores less data per memory cell than stored during the programmed state.

43. The method of claim 42, wherein the programmed state indicates that stored data is represented by a first set of threshold voltage distributions, and the overwritten state indicates that stored data is represented by a second set of threshold voltages distributions, the second set of threshold voltages distributions including at least one threshold voltage distribution not in the first set of threshold distributions.

44. A non-transitory recording medium, comprising:
    a storage area storing state information for at least one of the blocks, the state information indicating one of a clean state, a programmed state, an invalid state, an overwritable state, and an overwritten state, the clean state indicating the block is erased, the programmed state indicating the block stores valid data, the invalid state indicating the block stores invalid data, the overwritable state indicating that overwriting data is permitted without erasing invalid data stored in the block, the overwritten state indicating that at least a portion of the data stored in the block has been overwritten without erasing the block.

45. The recording medium of claim 44, wherein the storage area stores an overwrite number if the state information indicates the overwritten state, the overwrite number indicating a number of times since the block was last erased.

* * * * *